US012640753B2

(12) United States Patent
Gandhi et al.

(10) Patent No.: US 12,640,753 B2
(45) Date of Patent: May 26, 2026

(54) SELECTIVE AND FLEXIBLE COMPRESSION OF DATA ASSOCIATED WITH A MACHINE LEARNING MODEL

(71) Applicant: Meta Platforms, Inc., Menlo Park, CA (US)

(72) Inventors: Kaushal Gandhi, South San Francisco, CA (US); Olivia Wu, Los Altos, CA (US); Soheil Gharahi, Austin, TX (US); Thomas Mark Ulrich, Sunnyvale, CA (US); Abdulkadir Utku Diril, Menlo Park, CA (US); Khasim S. Dudekula, Scarsdale, NY (US); Eda Sahin, Sunnyvale, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 313 days.

(21) Appl. No.: 18/301,816

(22) Filed: Apr. 17, 2023

(65) Prior Publication Data

US 2024/0348263 A1 Oct. 17, 2024

(51) Int. Cl.
*H03M 7/42* (2006.01)
(52) U.S. Cl.
CPC ..................................... *H03M 7/42* (2013.01)
(58) Field of Classification Search
CPC ....................................................... H03M 7/42
USPC ........................................................ 382/234
See application file for complete search history.

(56) References Cited

U.S. PATENT DOCUMENTS

| | | | | |
|---|---|---|---|---|
| 2013/0275396 A1* | 10/2013 | Condict | .................. | H03M 7/30 |
| | | | | 707/693 |
| 2021/0027148 A1 | 1/2021 | Meng et al. | | |
| 2022/0013153 A1* | 1/2022 | Zafar | ................... | G11C 7/1006 |
| 2022/0404887 A1* | 12/2022 | Cruise | .................. | G06F 1/3203 |
| 2024/0236295 A1* | 7/2024 | Martinelli | .............. | H04N 19/70 |
| 2024/0340125 A1* | 10/2024 | Marzban | .............. | H04B 7/0456 |
| 2025/0175192 A1* | 5/2025 | Galvin | ................ | H03M 7/3059 |

FOREIGN PATENT DOCUMENTS

EP          4096100 A1    11/2022

OTHER PUBLICATIONS

European Search Report for European Patent Application No. 24162238.0, dated Aug. 15, 2024, 7 pages.
(Continued)

*Primary Examiner* — Allen H Nguyen
(74) *Attorney, Agent, or Firm* — EVERSHEDS SUTHERLAND (US) LLP

(57) ABSTRACT

Systems, apparatuses and methods provide technology that compresses first data based on a first compression scheme to generate second data, where the first data is associated with a first machine learning model. The technology stores the second data into a memory, adjusts a first entry of a lookup table to correspond to the first compression scheme based on the first data being compressed based on the first compression scheme, provide the second data from the memory to processing elements of a processing array during execution of the first machine learning model, and decompresses, at the processing array, the second data based on the lookup table to obtain the first data.

16 Claims, 16 Drawing Sheets

(56)             References Cited

OTHER PUBLICATIONS

Racape F., et al., "Adaptive and Conditional Arithmetic Coding for Lossless Compression of Deep Neural Networks," Interdigital, [NNR] CE3: Report on Arithmetic Coding Results, 130. MPEG Meeting, Apr. 10, 2020, 10 pages, retrieved from the Internet URL: http://phenix.int-evry.fr/mpeg/doc_end_user/documents/130_Alpbach/wg11/m53766-v1-m53766.zipm53766_presentation.pdf.

* cited by examiner

450

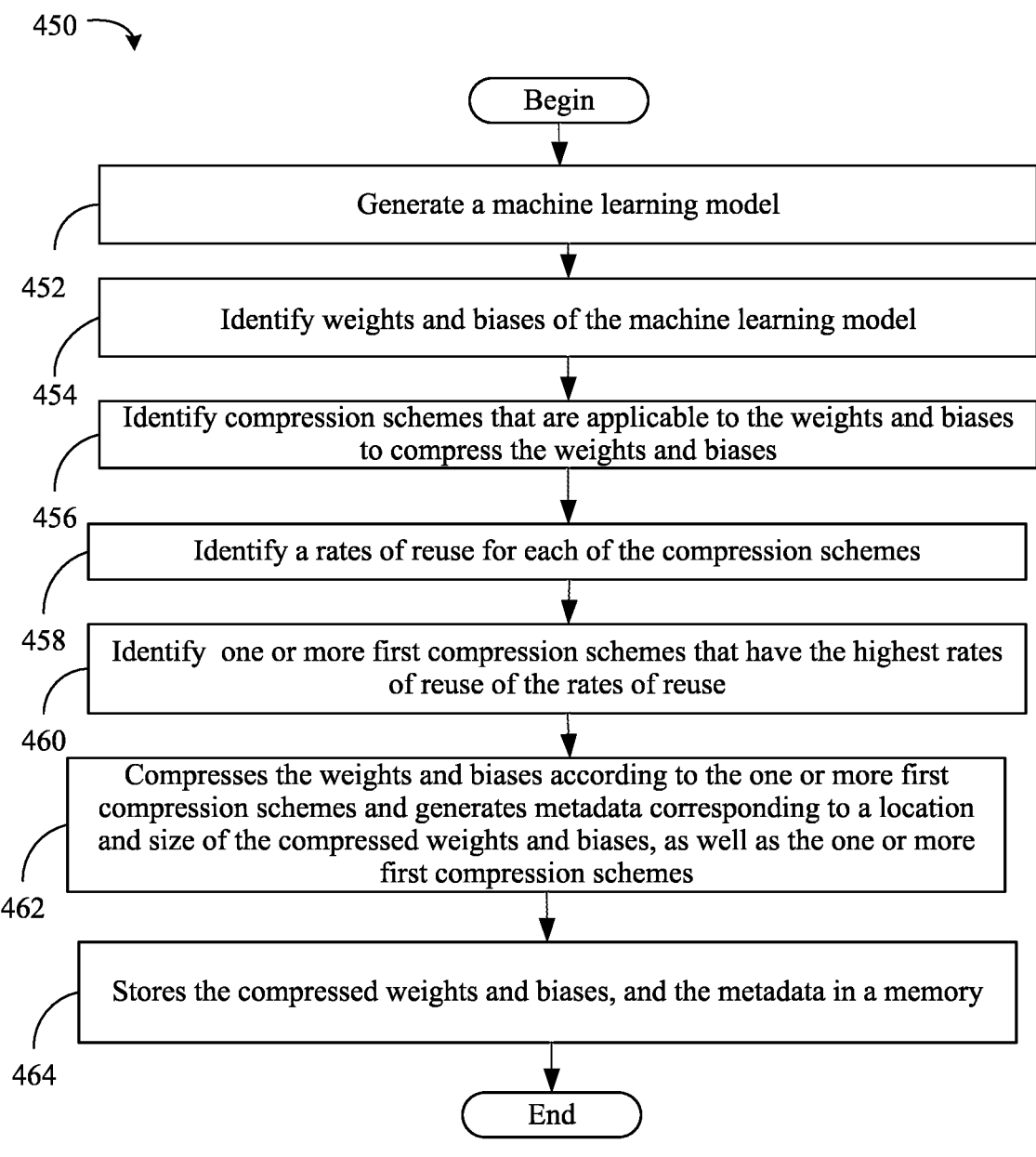

Begin

Generate a machine learning model

452

Identify weights and biases of the machine learning model

454

Identify compression schemes that are applicable to the weights and biases to compress the weights and biases

456

Identify a rates of reuse for each of the compression schemes

458

Identify one or more first compression schemes that have the highest rates of reuse of the rates of reuse

460

Compresses the weights and biases according to the one or more first compression schemes and generates metadata corresponding to a location and size of the compressed weights and biases, as well as the one or more first compression schemes

462

Stores the compressed weights and biases, and the metadata in a memory

464

End

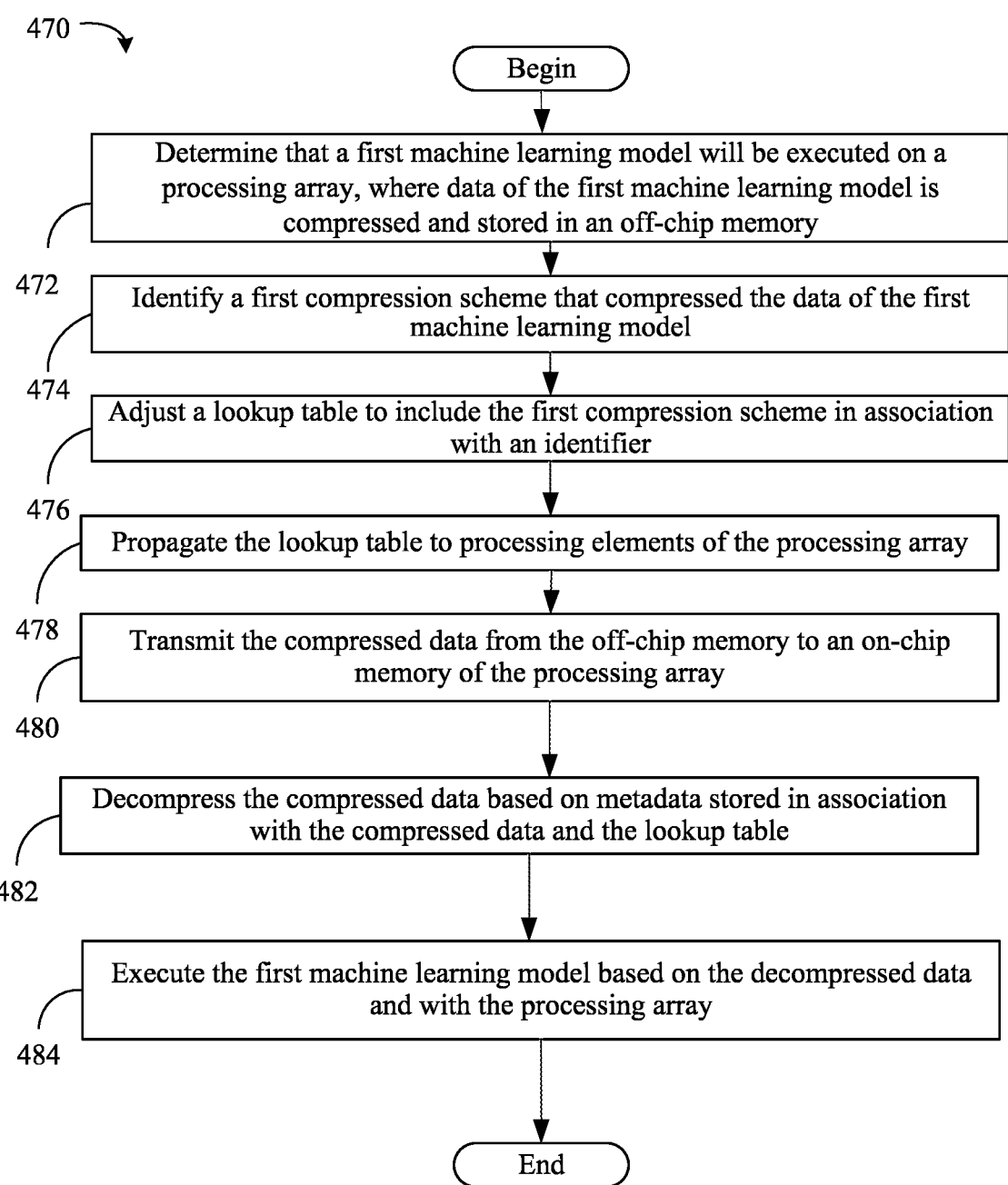

Begin

Determine that a first machine learning model will be executed on a processing array, where data of the first machine learning model is compressed and stored in an off-chip memory

472

Identify a first compression scheme that compressed the data of the first machine learning model

474

Adjust a lookup table to include the first compression scheme in association with an identifier

476

Propagate the lookup table to processing elements of the processing array

478

Transmit the compressed data from the off-chip memory to an on-chip memory of the processing array

480

Decompress the compressed data based on metadata stored in association with the compressed data and the lookup table

482

Execute the first machine learning model based on the decompressed data and with the processing array

484

End

FIG. 3

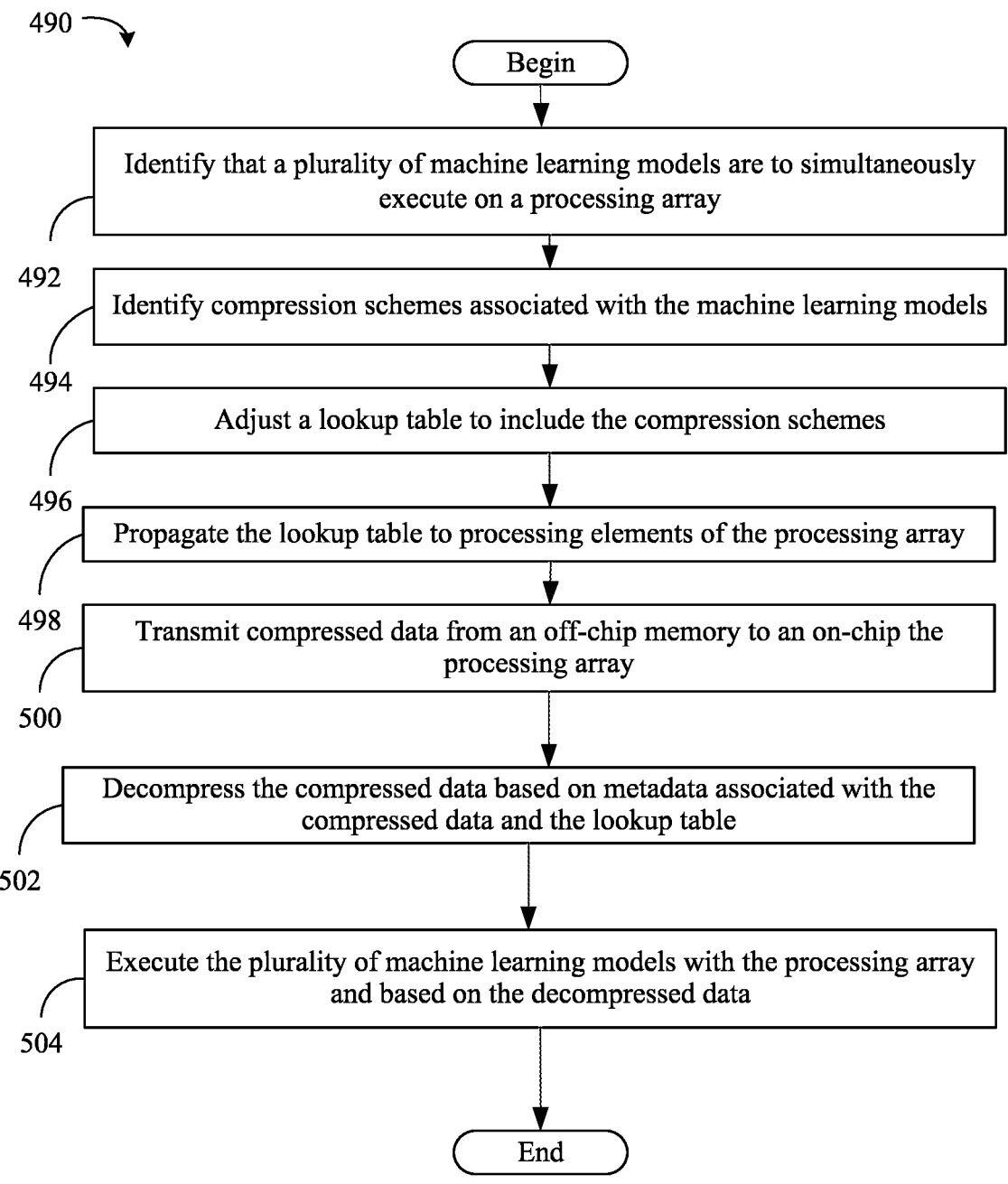

490

Begin

Identify that a plurality of machine learning models are to simultaneously execute on a processing array

492

Identify compression schemes associated with the machine learning models

494

Adjust a lookup table to include the compression schemes

496

Propagate the lookup table to processing elements of the processing array

498

Transmit compressed data from an off-chip memory to an on-chip the processing array

500

Decompress the compressed data based on metadata associated with the compressed data and the lookup table

502

Execute the plurality of machine learning models with the processing array and based on the decompressed data

504

End

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

| 0 | 1 | 2 | 3 | 8 | 9 | 10 | 11 |
|---|---|---|---|---|---|---|---|
| 4 | 5 | 6 | 7 | 12 | 13 | 14 | 15 |
| 16 | 17 | 18 | 19 | 24 | 25 | 26 | 27 |
| 20 | 21 | 22 | 23 | 28 | 29 | 30 | 31 |

SELECTIVE AND FLEXIBLE COMPRESSION OF DATA ASSOCIATED WITH A MACHINE LEARNING MODEL

BACKGROUND

Machine learning models may be trained based on training data. The machine learning models may execute an iterative training process to train the machine learning models based on the training data (e.g., via gradients). After being trained, the machine learning models may execute artificial intelligence (AI) inference. AI inference may be a process of using a trained machine learning model to make predictions or decisions based on input data. For example, inference may be a process of using a trained model to make predictions.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes at least one computer readable storage medium comprising a set of instructions, which when executed by a computing device, cause the computing device to compress first data based on a first compression scheme to generate second data, where the first data is associated with a first machine learning model. The instructions, when executed, cause the computing device to store the second data into a memory, and adjust a first entry of a lookup table to correspond to the first compression scheme based on the first data being compressed based on the first compression scheme. The instructions, when executed, cause the computing device to provide the second data from the memory to processing elements of a processing array during execution of the first machine learning model, and decompress, at the processing array, the second data based on the lookup table to obtain the first data. Other examples of this aspect include corresponding computer systems, apparatus, and computer programs recorded on one or more computer storage devices, each configured to perform the actions of the methods.

One general aspect includes a system comprising one or more processors, and a memory coupled to the one or more processors, the memory comprising instructions executable by the one or more processors, the one or more processors being operable when executing the instructions to compress first data based on a first compression scheme to generate second data, where the first data is associated with a first machine learning model. The one or more processors are further operable when executing the instructions to store the second data into a second memory, adjust a first entry of a lookup table to correspond to the first compression scheme based on the first data being compressed based on the first compression scheme, and provide the second data from the second memory to processing elements of a processing array during execution of the first machine learning model. The one or more processors are further operable when executing the instructions to decompress, at the processing array, the second data based on the lookup table to obtain the first data. Other examples of this aspect include corresponding computer systems, apparatus, and computer programs recorded on one or more computer storage devices, each configured to perform the actions of the methods.

One general aspect includes a method comprising compressing first data based on a first compression scheme to generate second data, where the first data is associated with a first machine learning model. The method also includes storing the second data into a memory. The method also includes adjusting a first entry of a lookup table to correspond to the first compression scheme based on the first data being compressed based on the first compression scheme. The method also includes providing the second data from the memory to processing elements of a processing array during execution of the first machine learning model. The method also includes decompressing, at the processing array, the second data based on the lookup table to obtain the first data. Other examples of this aspect include corresponding computer systems, apparatus, and computer programs recorded on one or more computer storage devices, each configured to perform the actions of the methods.

BRIEF DESCRIPTION OF THE DRAWINGS

The various advantages of the examples will become apparent to one skilled in the art by reading the following specification and appended claims, and by referencing the following drawings, in which:

FIG. 2 is a flowchart of an example of a method to compress and store data associated with a machine learning model according to an example of the disclosure;

FIG. 3 is a flowchart of an example of a method to compress and decompress machine learning data according to an example of the disclosure;

FIG. 4 is a flowchart of an example of a method to compress and decompress machine learning data according to an example of the disclosure;

FIG. 9A illustrates a diagram showing the layout of a compressed buffer that is being traversed in an example column major traversal pattern according to an example of the disclosure;

FIG. 9B illustrates a layout to store metadata in memory with no swap bit enabled according to an example of the disclosure;

FIG. 9C illustrates a layout of metadata in memory with the swap bit enabled according to an example of the disclosure;

DESCRIPTION EXAMPLE

Figure 1:
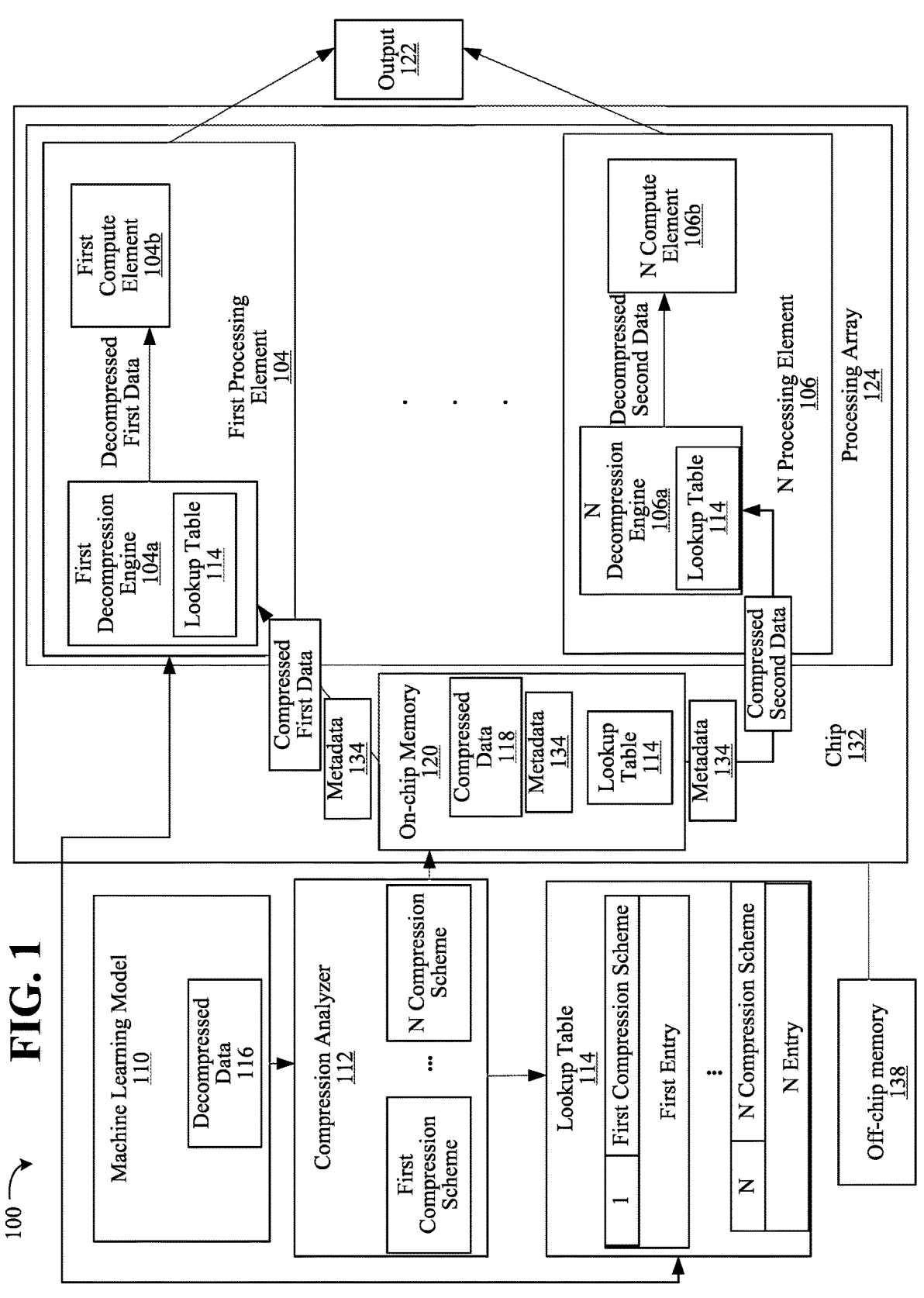
FIG. 1 illustrates a computing architecture that executes compression and decompression of machine learning model data according to an example of the disclosure.

Machine learning models may incur significant overhead and performance costs. For example, a machine learning model may include weights and biases. During inference, the machine learning model may receive data that is processed by the machine learning model to form predictions, classifications, decisions, etc. The data may be streamed in real-time into the machine learning model. Data associated with the machine learning model (e.g., weights, biases, input data, etc.) may have a significant size complicating storage and retrieval. For example, a chip may execute the inference process with the machine learning model. An available storage space of an on-chip memory of the chip may be unable to store all of the data, leading to lengthy fetches of data from storage locations (e.g., off-chip storage such as memory, hard drives or database) and evictions of data from the memory. Doing so increases latency (e.g., waiting for data) and compute resources (e.g., resources to evict data and retrieve data). For example, transmitting such data to the memory may consume significant amounts of bandwidth. In some examples, the machine learning model may be executed on multiple chips. Doing so increases compute resource consumption since multiple chips are utilized and further operations are executed to combine outputs of the multiple chips.

Examples herein enhance machine learning processes by compressing data in an efficient manner to reduce the amount of storage space to store the data of the machine learning model. Compressing the data to reduce the size of the data results in several enhancements, including reducing the amount of evictions and fetches from the memory, reducing the bandwidth to transmit the compressed data and lowering a memory footprint to execute the machine learning model. Moreover, since the data is compressed, the machine learning model may execute with reduced compute resources, for example by operating on a smaller number of chip (e.g., the machine learning model may not be split to operate on multiple chips based on memory constraints).

To implement the above, examples compress first data based on a first compression scheme to generate second data, where the first data is associated with a first machine learning model, store the second data into a memory, adjust a first entry of a lookup table to correspond to the first compression scheme based on the first data being compressed based on the first compression scheme, provide the second data from the memory to processing elements of a processing array during execution of the first machine learning model, and decompress, at the processing array, the second data based on the lookup table to obtain the first data. The second data (the compressed data) may be stored in the memory to reduce a memory footprint of the data relative to uncompressed data (e.g., the first data), reduce compute resources and power. In doing so, the number of evictions and fetches is reduced to lessen the latency and compute resources while still maintaining accuracy.

That is, existing implementations that execute on uncompressed data or inefficiently compressed data are a challenge when operating with high-quality machine learning models.

Examples herein are directed to a technological improvement: an enhanced computer compression and decompression system. Examples include a specific improvement in computer capabilities (e.g., intelligent compression schemes that may be balance performance and reuse considerations) instead of a "process that qualifies as an 'abstract idea' for which computers are invoked merely as a tool." Thus, examples herein are enhanced relative to existing examples.

Turning now to FIG. 1, a computing architecture 100 (e.g., computing device(s), server(s), compute node(s), etc.) is illustrated. The computing architecture 100 may employ an enhanced compression and decompression scheme to store data (e.g., weights, biases, input data, etc.) for a machine learning model 110 into on-chip memory 120 (e.g., on chip static random-access memory (SRAM)) for performance reasons noted above (e.g., lower latency, reduced memory usage, reduced compute resources, etc.). If, alternatively, the data for the machine learning model 110 cannot fit into the on-chip memory 120, the data may have to be stored in an off-chip memory 138 (e.g., a dynamic random access memory) that is not on a chip 132, and brought into the on-chip memory 120 and/or the processing array 124 in pieces during different time periods, increasing latency, power and transfer overhead. In another alternative, the machine learning model 110 may have to run on multiple chips and/or devices to accomplish model parallelism. Outputs from the multiple chips and/or devices are then combined to generate a final output. Doing so significantly increases compute resources and power consumption. Examples herein address the above to save power since off-chip memory 138 accesses will be reduced and also reduce bandwidth (e.g., Peripheral Component Interconnect Express (PCIE) bandwidth) as well as compute resources (e.g., execute on a reduce number of devices and/or chips). For example, the weights of the machine learning model 110 may be compressed so that all the weights may be stored into the on-chip memory 120 at the same time and then decompressed at a time of consumption in corresponding processing elements of a plurality or processing elements.

For example, the machine learning model 110 may be generated. The machine learning model 110 may be trained in an iterative process over a plurality of training batches. During each iteration, the machine learning model 110 may be trained based on a batch of the plurality of batches, and updated (e.g., via a backpropagation process) based on how accurately the machine learning model 110 operated on the batch. During the training, data (e.g., weights and biases) of the machine learning model 110 may be updated. The data may be referred to as decompressed data 116. In some examples, the data may also include inputs, such as features and/or the characteristics of the data that are used to make predictions or classifications by the machine learning model 110.

The decompressed data 116 may be parameters (e.g., weights and biases that are used to compute activations) of the machine learning model 110. The decompressed data 116 may occupy a significant amount of memory space. To reduce the size of the decompressed data 116, a compression analyzer 112 may analyze the decompressed data 116 to determine different compression schemes to efficiently compress the decompressed data 116. The compression analyzer 112 may operate as the machine learning model 110 is being generated, and/or offline prior to inference with the machine learning model 110 to avoid delays during inference. A plurality of compression schemes may be applied to the decompressed data 116. In some examples, only one compression scheme is applied to the decompressed data 116 with different parts of the compression scheme being stored in different entries of lookup table 114.

In detail, at compile time, the compression analyzer 112 (e.g., a software implementation) may compress the decompressed data 116 at the time of model creation of the machine learning model 110 to generate compressed data 118, generate metadata 134 and generate lookup table 114. The metadata 134 is information to help in decompression of the compressed data 118 to obtain the decompressed data 116. As will be explained below, the compression analyzer 112 generates the lookup table 114 and may be updated to contain a decompression scheme associated with the metadata 134. The lookup table 114 is accessed to decompress the compressed data 118. The lookup table 114 may comprise a certain number of entries (e.g., 512) that are each a predefined amount of bits (e.g., 21-bits). The bits may be purely related to an ANS decode algorithm to decode compressed data.

The compression analyzer 112 analyzes the decompressed data 116 ahead of inference time, and determines which values (the most common values) for a given element size (e.g., 8 bits or 8-bit symbol) are used most often. Then the most common values are encoded using a few bits, which is less than the original number of bits representing the most common values in the decompressed data 116, while the least likely values to be used may take up as many bits as the original value or even greater if desired. The compression analyzer 112 may execute offline before the data is actually used for any sort of compute.

The compressed data 118 (e.g., compressed weights and biases), metadata 134 and lookup table 114 may be stored into on-chip memory 120 and/or off-chip memory 138 in association with the metadata 134. In some examples, the off-chip memory 138 may store the compressed data 118, metadata 134 and lookup table 114 prior to the processing array 124 executing the machine learning model 110. When the processing array 124 executes the machine learning model 110 during inference, the compressed data 118 is transferred from the off-chip memory 138 to the on-chip memory 120. The compressed data 118 includes the compressed weights, biases and/or input data. The metadata 134 includes information describing the compression that took place in a contiguous memory region of the compressed data 118. The compression and decompression algorithm may be Asymmetric Numeral Systems (ANS) for example. In some examples, the metadata 134 is generated based on the underlying assumption that only ANS was used to compress the decompressed data 116, and each of the different entries of the lookup table 114 corresponds to a different portion of the compressed data 118 (e.g., how to decompress the portion). For example, each of the different entries in the lookup table 114 ultimately corresponds to different 8-bit symbols (i.e. decompressed data) to be produced by the incoming stream of compressed data. Given a stream of compressed data from the compressed data 118, the lookup table 114 ultimately holds a mapping between the compressed data and what the corresponding decompressed data should be and also information on how to decompress the next element in the incoming compressed data stream. Doing so alleviates any obligation to indicate that the compression algorithm is ANS from the metadata 134. In some examples, each compressed chunk comprising compressed data 118 may have an associated 4B metadata such as the metadata 134. The metadata 134 may be used to find the ultimate location of where corresponding compressed data (e.g., compressed first data and/or compressed second data) is located, as well as the size of the compressed data. Below are the fields of the metadata:

[31]: Intentional bit, used to indicate that the programming is intentional.

[30:27]: Left-half compression size, 4'b0000=1 32B-beat

[26:23]: Right-half compression size, 4'b0000=1 32B-beat

[22:0]: data offset

Metadata for a given compressed buffer is stored in a contiguous region of on-chip memory 120 (e.g., LLS/DRAM) and/or off-chip memory 138 in 32B aligned fashion where each 32B contains 8 4B metadata. In some examples, the on-chip memory 120 may be bypassed and portions of the compressed data 118, metadata 134 and lookup table 114 may be transmitted from the off-chip memory 138 to the processing array 124.

In this example, the compression analyzer 112 applies different compression schemes to the decompressed data 116. The compression analyzer 112 may determine whether the different compression schemes efficiently compress the data, and apply a compression scheme of the different compression schemes to the decompressed data 116 in response to the compression scheme meeting a threshold. For example, the compression analyzer 112 identifies that a first portion (e.g., chunk) of the first data is compressed by an amount based on a first compression scheme of the different compression schemes, and determines that the first portion is to be compressed with the first compression scheme based on the amount meeting a memory threshold. The memory threshold may be a value that is set to ensure that all of the compressed data 118 is able to be stored in the on-chip memory 120 at a same time, for example total amount of available memory space divided by the number of chunks and/or portions of the compressed data 116.

For example, the available memory space of the on-chip memory 120 may be constrained to a specific value. The size of the decompressed data 116 may be greater than the specific value, meaning that all of the decompressed data 116 is unable to be stored into the on-chip memory 120 at the same time. As such, the compression analyzer 112 may search for a compression scheme that reduces the size of the decompressed data 116 to be equal to or less than the available memory space of the on-chip memory 120 to reduce memory fetches, power, latency etc. noted above. In this example, the first compression scheme may be determined to reduce the size of the decompressed data 116 to be less than the specific value. In some examples, the compression analyzer 112 may apply a test compression scheme to the decompressed data 116 to generate test data and determine if the test data is able to fit into the on-chip memory 120. If so, the compression analyzer 112 may then determine that the test compression scheme is to be applied to the decompressed data 116. Otherwise, the test compression scheme would be bypassed and the decompressed data 116 would not be compressed according to the first compression scheme.

The compression analyzer 112 may further consider latency and overhead aspects relating to the lookup table 114 when identifying compression schemes to apply to the decompressed data 116. The processing array 124 may decompress data based on the lookup table 114. The lookup table 114 stores different compression schemes in association with lookup values. Metadata, such as metadata 134, may reference the lookup value from the lookup table 114 to retrieve a compression scheme to decompress data associated with the metadata. In some examples, the lookup table 114 may include only one compression scheme, with each entry corresponding to a different value (e.g., symbol).

In some examples, an ANS decompression algorithm uses the lookup table 114 to lookup a calculated 9-bit value and produce an 8-bit symbol. To limit fanout issues, in the design the lookup table 114 may be replicated four times so that each entry in the lookup table 114 has a fan out of 8. Each entry may be 21-bits, starting from most significant bit to least significant bit, including 4-bit "nbits" value, 9-bit "newX" value, and 8-bit symbol decompressed in that cycle.

In each cycle, the following operations may be executed. There may be an nbit value associated with each element getting decompressed in a cycle. Each nbit value indicates how many bits each compressed element takes up (e.g., operates as a mask based on the number of bits actually used up by the element, as indicated by the "nbit" value associated with each element, valid values being 0 to 9). The nbit value comes from the lookup table 114, except for the first cycle where all nbit values are 9 since the first set of numbers read are the starting lookup table 114 indices and a lookup table 114 index is 9-bits. The nbit values are used to calculate where the start of each compressed element is located. For example, element [0] starts at bit [0], element [1] starts at nbit [0], element [2] starts at (nbit [0]+nbit [1]), element [3] starts at (nbit [0]+nbit [1]+nbit [2]), and so on. In order to figure out how many total bits were consumed from the incoming bit stream, examples add all 32 4-bit nbit values. This will be the right shift amount used to right shift the current cycle's contents of the staging buffer to get ready for next cycle. Once the starting positions of all elements are known, the starting positions may be used to MUX out the appropriate bits (e.g., worst case is that each compressed element is 9-bits). Once the 9-bit value associated with each element is identified, the 9-bit value is masked based on the number of bits actually used by the element, as indicated by the "nbit" value associated with each element. The output of this is still a 9-bit value for each element where the top bits are masked appropriately. The 9-bit masked value is then added to a 9-bit "newX" prime value, for each element. "newX" prime may be the "newX" value which comes from the lookup table 114 except that for the first cycle it is 0. Thus, there may be three values read from the lookup table 114, the uncompressed 8-bit symbol for each of the elements, the nbit value to be used for next cycle, and the newX value to be used for the next cycle. In some examples, the lookup table 114 may store a number of different compression schemes with each compression scheme having unique compression details being stored in a group of entries of the lookup table 114.

The lookup table 114 may be able to store a certain number of entries (ranging from a first entry to an N entry) that each comprise a different compression scheme. The compression schemes in the lookup table 114 may be updated and/or changed when new data is loaded into the processing array 124 to reflect how the new data was compressed. For example, the new data may be compressed with a new compression scheme that was not previously stored in the lookup table 114. Thus, when the new data is loaded into the processing array 124, the lookup table 114 may be correspondingly updated to include the new compression scheme. When the new data is decompressed, metadata associated with the new data may reference the appropriate entry in the lookup table 114 to retrieve the new compression scheme and/or entry from the appropriate location. The new data may be decompressed based on the new compression scheme retrieved from the lookup table 114. As such, the compression schemes are selected based on whether the compression schemes will be reused a number of times to offset the overhead from updating and/or loading the lookup table 114 into the first-N processing elements 104-106.

For example, the compression analyzer 112 may predict that the first compression scheme is to be applied at least a first number of times to the decompressed data 116, determine that the at least the first number of times meets a reuse threshold (a number that may be selected to offset the overhead from updating the lookup table), select the first compression scheme based on the at least the first number of times meeting the reuse threshold, compress the decompressed data 116 with the first compression scheme to generate the compressed data 118 and reduce the size of the decompressed data 116 to be less than or equal to the available memory space of the on-chip memory 120, generate metadata 134 to associate the first compression scheme with the compressed data 118, and store the compressed data 118 in association with the metadata 134 into the on-chip memory 120. In some examples, the compressed data 118 may be stored in association with metadata 134 in the off-chip memory 138, and then provided to the on-chip memory 120 when the machine learning model 110 is executed.

The compression analyzer 112 may also determine amortization aspects of the compression schemes. That is, a compression scheme may be selected if the compression scheme compresses the decompressed data 116 (e.g., is applied a number of times) to an extent that outweighs overhead from updating the lookup table 114 to include the compression scheme. In some examples, a compression ratio based on the compression scheme being applied to the decompressed data 116 may be identified and is compared to a compression threshold. If the compression ratio meets the compression threshold, the benefits of compression scheme may be deemed to outweigh the overhead from updating the lookup table 114, and the compression analyzer 112 may compress the decompressed data 116 based on the compression scheme.

In some examples, the compression analyzer 112 further determines whether applying further compression would be beneficial from a latency standpoint. For example, the decompressed data 116 may be compressed by a significant amount. After a point in compression, the drawbacks from further compression outweigh the benefits. For example, the lookup table 114 may be adjusted and/or modified to include compression schemes. In detail, suppose that the lookup table 114 may only store four entries. If five compression schemes are used to compress the decompressed data 116 into the compressed data 118, then the lookup table 114 will be adjusted to swap the compression schemes since not all five compression schemes may be stored in the lookup table 114 at a same time. Updating and/or modifying the lookup table 114 may increase latency. If the decompressed data 116 may be compressed into the compressed data 118 with only four of the compression schemes such that all of the compressed data 118 may be stored in the on-chip memory 120, then the fifth compression scheme may be deemed to provide minimal memory benefits while increasing latency. Thus, the fifth compression scheme may be bypassed for compressing the decompressed data 116 since doing so provides minimal memory advantages and increases latency. Thus, some examples may compress the decompressed data 116 only by an amount to ensure that all the compressed data 118 may be stored in the on-chip memory 120, and cease compression and/or analysis for further compression by the compression analyzer 112 when all the compressed data 118 is able to be stored in the on-chip memory 120.

In the above, it bears note that the decompressed data 116 may be divided into chunks (e.g., 32×32 byte size, with 1 k elements for int8/uint8 weights from a weight matrix and/or weight matrices). A given chunk can either be compressed or uncompressed.

In this example, the compression analyzer 112 determines that the decompressed data 116 is to be compressed with the first compression scheme. The compression analyzer 112 generates the metadata 134. The metadata 134 provides instructions and/or data to decompress the compressed data 118 based on the lookup table 114. In some examples, the decompressed data 116 may be compressed with a plurality of compression schemes and the metadata 134 may reflect as much.

The compressed data 118 and the metadata 134 may be stored in the on-chip memory 120 of the chip 132 when the machine learning model 110 executes inference. For example, the processing array 124 may implement the machine learning model 110 to execute inference. The chip 132 may physically have the processing array 124 and the on-chip memory 120 formed on the chip 132.

During inference with machine learning model 110, the processing array 124 may receive the compressed data 118. The processing array 124 includes a plurality of processing elements. For example, a first processing element 104 of the plurality of processing elements receives compressed first data, which is a first portion of the compressed data 118. An N processing element 106 of the plurality of processing elements receives compressed second data, which is a second portion of the compressed data 118 different from the first portion. Both the first processing element 104 and the N processing element 106 receive the metadata 134.

A first decompression engine 104a of the first processing element 104 decompresses the compressed first data (e.g., in real-time) based on the metadata 134 and the lookup table 114 to generate decompressed first data. As will be discussed below, the metadata 134 may provide instructions to decompress the compressed first data based on the lookup table 114. The first decompression engine 104a provides the decompressed first data to the first compute element 104b. In some examples, rather than receiving all the metadata 134, the first processing element 104 receives a first part of the metadata 134 that corresponds to the compressed first data, and not other parts of the metadata 134 that do not correspond to the compressed first data. Doing so may reduce communication bandwidth.

The first processing element 104 includes the first compute element 104b. The first compute element 104b may be an arithmetic-logic unit, adder, multiplier, etc. The first compute element 104b may also include various logic gates. The first compute element 104b executes an operation on the decompressed first data to generate a first value that comprises part of the output 122.

An N decompression engine 106a of the N processing element 106 decompresses the compressed second data (e.g., in real-time) based on the metadata 134 and the lookup table 114 to generate decompressed second data. As will be discussed below, the metadata 134 may provide instructions to decompress the compressed second data based on the lookup table 114. The N decompression engine 106a provides the decompressed second data to the N compute element 106b. In some examples, rather than receiving all the metadata 134, the N processing element 106 receives a second part of the metadata 134 that corresponds to the compressed second data, and not other parts of the metadata 134 that do not correspond to the compressed second data. Doing so may reduce communication bandwidth.

The N processing element 106 includes the N compute element 106b. The N compute element 106b may be an arithmetic-logic unit, adder, multiplier, etc. The N compute element 106b may also include various logic gates. The N compute element 106b executes an operation on the decompressed second data to generate a second value that comprises part of the output 122.

Notably, the compression analyzer 112 compresses the decompressed data 116 into the compressed data 118 offline and prior the machine learning model 110 being executed during inference. Doing so reduces latency during inference. In such examples, the compressed data 118 may stored into the off-chip memory 138 and then moved into the on-chip memory 120 from the off-chip memory 138 during inference.

Furthermore, since the compressed data 118 is stored in the off-chip memory 138 and/or the on-chip memory 120, less memory is occupied in the off-chip memory 138 and/or the on-chip memory 120 by the compressed data 118 relative to storing the decompressed data 116 into the off-chip memory 138 and/or the on-chip memory 120. Furthermore, bandwidth is reduced since the compressed data 118 is transferred between the compression analyzer 112, off-chip memory 138 and/or the on-chip memory 120. Moreover, the compressed first data and the compressed second data are decompressed at the first and N processing elements 104, 106 to avoid transferring all of the decompressed data 116, reducing communication and computational bandwidth.

In some examples, different portions of the decompressed data 116 may be compressed according to several compression schemes, such as the first compression scheme and the N compression scheme. In such examples, the lookup table 114 is adjusted to include the N compression scheme and the metadata 134 is adjusted accordingly.

In some examples, the first-N processing elements 104-106 may receive different lookup tables. For example, suppose that the first processing element 104 is executing a first workload associated with the machine learning model 110 (e.g., a first machine learning model). Furthermore, suppose that the N processing element 106 is executing a second workload associated with a second machine learning model. First data associated with the first machine learning model will be different than second data associated with the second machine learning model. Thus, the compression schemes applied to the second machine learning model may be different than the compression schemes applied to the first machine learning model. Therefore, different lookup tables may be generated for the first machine learning model, and the second machine learning model. Thus, the first processing element 104 may receive a first lookup table to decompress the first data, while the N processing element 106 may receive a second lookup table (including different compression schemes from the first lookup table) that is different from the first lookup table. In other examples, the same lookup table 114 is provided to all of the processing elements of the processing array 124.

In some examples, different data may be compressed differently. For example, other data may be compressed according to a second compression scheme and decompressed accordingly. The other data may be associated with the machine learning model 110, or may be associated with a different machine learning model.

Thus, examples as described herein reduce latency, compute resources and memory storage to execute the machine learning model 110. Furthermore, the lookup table 114 may be adjusted on the fly, and permit adaptation to changes in data associated with the machine learning model 110.

For example, suppose that the decompressed data 116 corresponds to a first layer of the machine learning model 110. After the processing array 124 completes execution of the first layer, new data representing a second layer of the machine learning model 110 may be identified. The new data may be compressed (similarly to as described above) based on different compressions schemes that are different from the first and N compression schemes that were applied to the decompressed data 116 to generate the compressed data 118. The lookup table 114 may be adjusted to include the different compression schemes for the new data and remove the first and N compression schemes. Furthermore, the new data may be associated with new metadata. The plurality of processing elements may decompress the new data based on the new metadata and the updated lookup table 114, similarly to as described above, and execute computations associated with the second layer. In some examples, the decompressed data 116 may be decompressed according to multiple compression schemes.

The computing architecture 100 may be implemented in a computing device including a memory and processor, computing system (e.g., hardware, configurable logic, fixed-function logic hardware, at least one computer readable storage medium comprising a set of instructions for execution, etc.) and so forth. Examples herein may operate in software and/or hardware.

In some examples, the computing architecture 100 compresses the decompressed data 116 (e.g., first data) based on a first compression scheme to generate compressed data 118 (e.g., second data), wherein the decompressed data 116 is associated with the machine learning model 110 (e.g., a first machine learning model). In such examples, the computing architecture 100 stores the compressed data 118 (e.g., second data) into one or more of the off-chip memory 138 and/or the on-chip memory 120 (e.g., a memory), adjust a first entry of the lookup table 114 to correspond to the first compression scheme based on the decompressed data 116 (e.g., first data) being compressed based on the first compression scheme, provides the compressed data 118 (e.g., second data) from the off-chip memory 138 and/or the on-chip memory 120 to processing elements, such as the first and N processing elements 104, 106, of the processing array 124 during execution of the machine learning model 110, and decompresses, at the processing array 124, the compressed data 118 (e.g., second data) based on the lookup table 114 to obtain the first data.

The computing architecture 100 may also compress third data based on a second compression scheme to generate fourth data, where the third data is associated with a second machine learning model, store the fourth data into the off-chip memory 138 and/or the on-chip memory 120, adjust a second entry of the lookup table 114 to correspond to the second compression scheme based on the third data being compressed based on the second compression scheme, provide the third data from the off-chip memory 138 and/or the on-chip memory 120 to the processing array 124 during execution of the second machine learning model, and decompress, at the processing array 124, the fourth data based on the lookup table 114 to obtain the third data. In such examples, the computing architecture 100 replaces the first entry in the lookup table 114 with the second entry. In other examples, the computing architecture 100 inserts the second entry into the lookup table 114 so that the lookup table 114 includes the first entry and the second entry.

In some examples, the computing architecture 100 identifies that a first portion of the decompressed data 116 is compressible by an amount based on the first compression scheme, and determine that the first portion is to be compressed with the first compression scheme based on the amount meeting a compression threshold.

In some examples, the computing architecture 100 determines that compression of the decompressed data 116 into the compressed data 118 with the first compression scheme reduces a size of the decompressed data 116 to be less than or equal to an available memory space of the on-chip memory 120, predicts that the first compression scheme is to be applied at least a first number of times, determines that the at least the first number of times meets a reuse threshold, selects the first compression scheme based on the at least the first number of times meeting the reuse threshold, and compression of the first data with the first compression scheme reducing the size of the decompressed data 116 to be less than or equal to the available memory space, generate metadata 134 to associate the first compression scheme with the compressed data 118, and store the compressed data 118 in association with the metadata 133 into the on-chip memory 120.

FIG. 2 illustrates a method 450 to compress data associated with a machine learning model (e.g., neural network). One or more aspects of method 450 may be implemented as part of and/or in conjunction with the computing architecture 100 (FIG. 1). Method 450 may be implemented in a computing device, computing system (e.g., hardware, configurable logic, fixed-function logic hardware, at least one computer readable storage medium comprising a set of instructions for execution, etc.).

Illustrated processing block 452 generates a machine learning model. Illustrated processing block 454 identifies weights and biases of the machine learning model. Illustrated processing block 456 identifies compression schemes that are applicable to the weights and biases to compress the weights and biases. Illustrated processing block 458 identifies rates of reuse (e.g., how many chunks of data each compression scheme may compress, a compression ratio, etc.) for each of the compression schemes. Illustrated processing block 460 identifies one or more first compression schemes that have the highest rate of reuse of the rates reuse. In some examples, processing block 460 includes the one or more first compression schemes being selected based on the one or more first compression schemes being able to compress the weights and biases such that the compressed weights and biases are able to be simultaneously stored in on-chip memory. Illustrated processing block 462 compresses the weights and biases according to the one or more first compression schemes and generates metadata corresponding to a location and size of the compressed weights and biases, as well as the one or more first compression schemes. Illustrated processing block 462 may include bypassing a second compression scheme of the compression schemes to compress the weights and biases. The second compression scheme may have a rate of reuse that is lower than the rate of reuse of the one or more first compression schemes. Avoiding the second compression scheme for compressing the weights and biases may reduce overhead from updating a lookup table to reflect the second compression scheme when the benefits for compression with the second compression scheme are minimal or below a threshold (e.g., rate of reuse of the second compression scheme is below a threshold). Illustrated processing block 464 stores the compressed weights and biases, and the metadata in a memory (e.g., an off-chip memory).

FIG. 3 illustrates a method 470 to compress and decompress machine learning data. One or more aspects of method 470 may be implemented as part of and/or in conjunction with the computing architecture 100 (FIG. 1) and/or method 450 (FIG. 2). Method 470 may be implemented in a computing device, computing system (e.g., hardware, configurable logic, fixed-function logic hardware, at least one computer readable storage medium comprising a set of instructions for execution, etc.).

Illustrated processing block 472 determines that a first machine learning model will be executed on a processing array, where data of the first machine learning model is compressed and stored in an off-chip memory. Illustrated processing block 474 identifies a first compression scheme that compressed the data of the first machine learning model. Illustrated processing block 476 adjusts a lookup table to include the first compression scheme in association with an identifier (e.g., stored in a specific slot). Illustrated processing block 478 propagates the lookup table to processing elements of the processing array. Illustrated processing block 480 transmits the compressed data from the off-chip memory to an on-chip memory associated with the processing array. Illustrated processing block 482 decompresses the compressed data based on metadata stored in association with the compressed data and the lookup table. Illustrated processing block 484 executes the first machine learning model based on the decompressed data and with the processing array.

FIG. 4 illustrates a method 490 to execute multiple machine learning models on a processing array with the enhanced compression and decompression of machine learning data described herein. One or more aspects of method 490 may be implemented as part of and/or in conjunction with the computing architecture 100 (FIG. 1), method 450 (FIG. 2) and/or method 470 (FIG. 3). Method 490 may be implemented in a computing device, computing system (e.g., hardware, configurable logic, fixed-function logic hardware, at least one computer readable storage medium comprising a set of instructions for execution, etc.).

Illustrated processing block 492 identifies that a plurality of machine learning models is to simultaneously execute on a processing array. Illustrated processing block 494 identifies compression schemes associated with the machine learning models. Illustrated processing block 496 adjusts a lookup table to include the compression schemes. In some example, different lookup tables are utilized by the different machine learning models. Processing block 496 stores the compression schemes in association with identifiers. The identifiers may be references in metadata associated with data that is to be decompressed. For example, processing block 496 includes lookup table (LUT) values (which were generated offline and prior to the execute of method 490) associated with the compression scheme used for that model being loaded into the memory appropriately along with the compression schemes. Illustrated processing block 498 propagates the lookup table (or lookup tables) to processing elements of the processing array. In some examples, processing bock 498 includes transmitting different lookup tables to different processing elements depending on which machine learning models the different processing elements are executing. Illustrated processing block 500 transmits compressed data (that is associated with the machine learning models) from an off-chip memory to an on-chip memory of the processing array. Illustrated processing block 502 decompresses the compressed data based on metadata associated with the compressed data and the lookup table. Illustrated processing block 504 executes the plurality of machine learning models with the processing array and based on the decompressed data.

Figure 5:
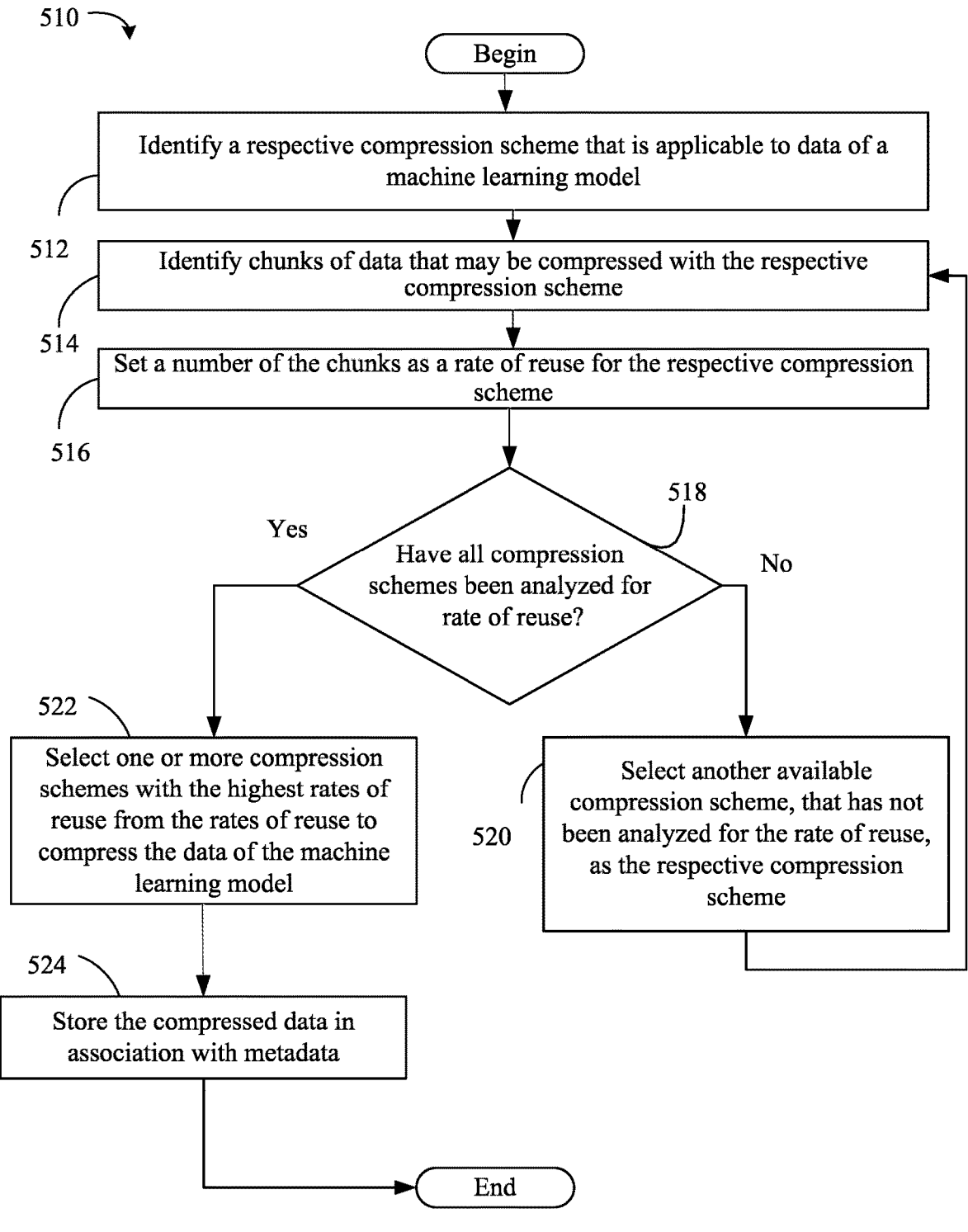
FIG. 5 is a flowchart of an example of a method to compress data for machine learning models according to an example of the disclosure.

FIG. 5 illustrates a method 510 to compress data for machine learning models. One or more aspects of method 510 may be implemented as part of and/or in conjunction with the computing architecture 100 (FIG. 1), method 450 (FIG. 2), method 470 (FIG. 3) and/or method 470 (FIG. 4). Method 510 may be implemented in a computing device, computing system (e.g., hardware, configurable logic, fixed-function logic hardware, at least one computer readable storage medium comprising a set of instructions for execution, etc.).

Illustrated processing block 512 identifies a respective compression scheme that is applicable to data of a machine learning model. Illustrated processing block 514 identifies chunks of data that may be compressed with the respective compression scheme. Illustrated processing block 516 sets a number of the chunks as a rate of reuse for the respective compression scheme. Illustrated processing block 518 determines if all compression schemes been analyzed for rate of reuse. If not, illustrated processing block 520 selects another available compression scheme, that has not been analyzed for the rate of reuse, as the respective compression scheme, and processing block 514 re-executes. Otherwise, illustrated processing block 522 selects one or more compression schemes with the highest rates of reuse from the rates of reuse to compress the data of the machine learning model. Illustrated processing block 524 stores the compressed data in association with metadata that identifies how the data is compressed.

Figure 6A:
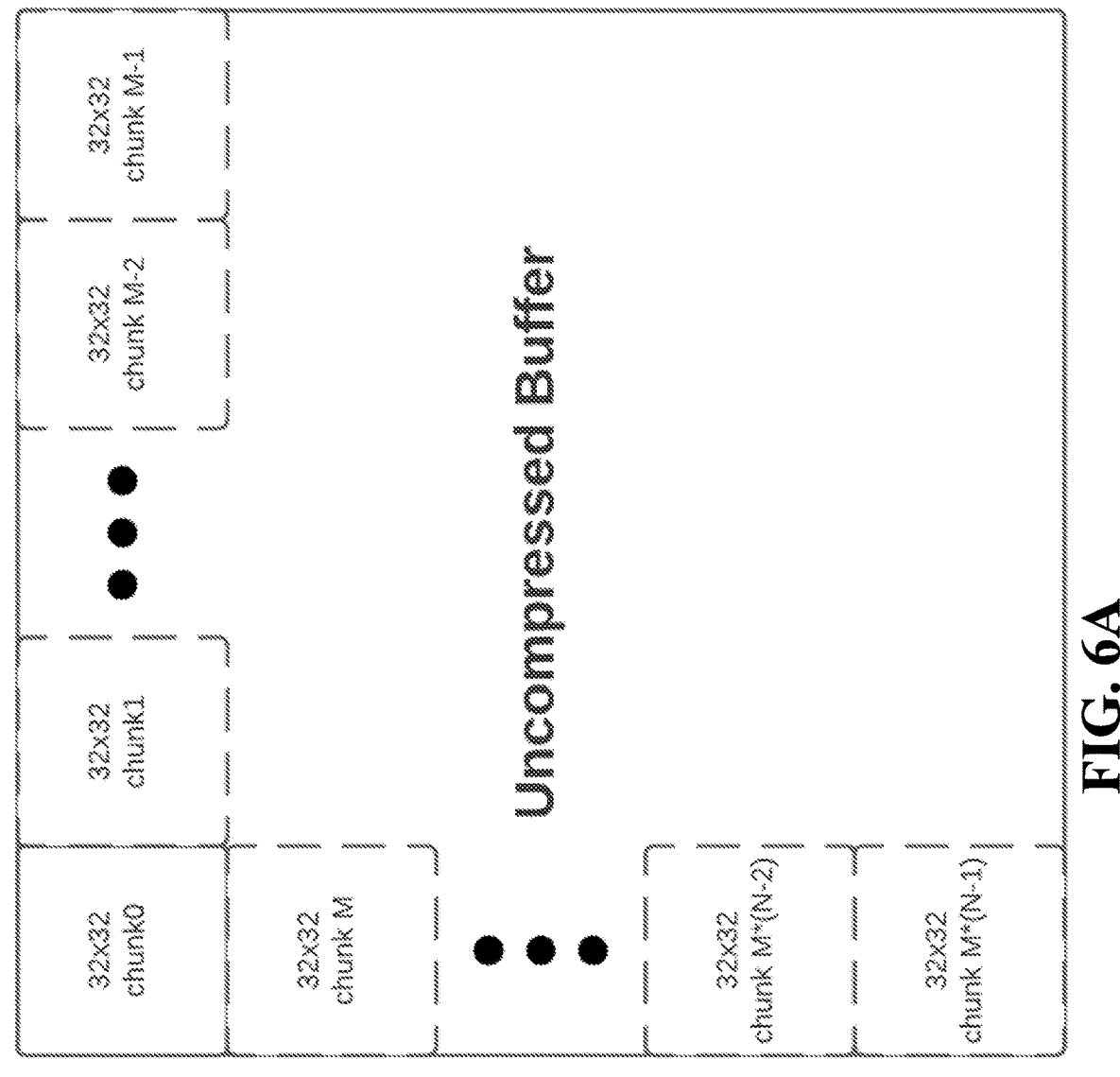
FIG. 6A illustrates a decompressed buffer according to an example of the disclosure.
Figure 6B:
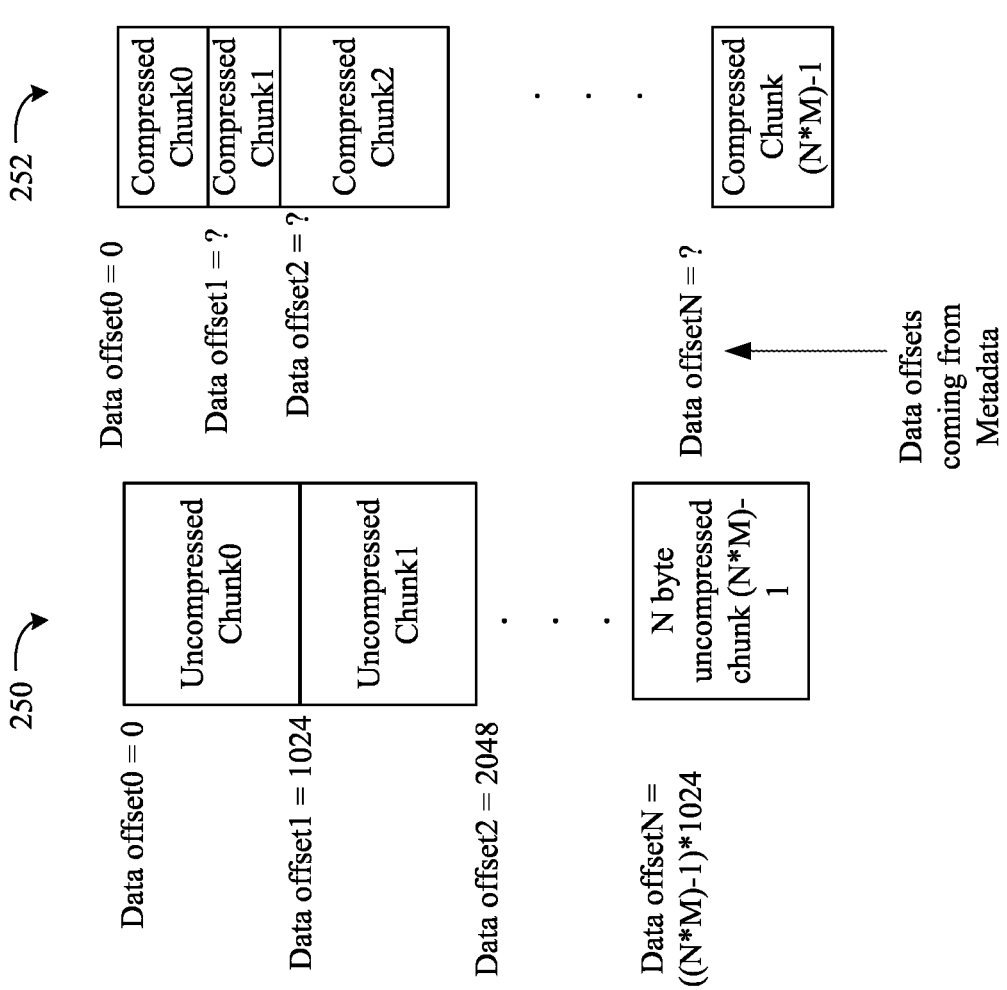
FIG. 6B illustrates a memory layout according to an example of the disclosure.

FIGS. 6A-6B are diagrams illustrating the life cycle of a compressed buffer. FIG. 6A illustrates how a decompressed buffer 200 includes an uncompressed weight matrix. The uncompressed weight matrix is broken down into smaller 32×32 chunks. FIG. 6B illustrates how the uncompressed and compressed versions would be laid out in memory. One or more aspects of the decompressed buffer 200, a memory layout 250 for uncompressed chunks, and a memory layout for compressed chunks 252 may be implemented as part of and/or in conjunction with the computing architecture 100 (FIG. 1), method 450 (FIG. 2), method 470 (FIG. 3), method 470 (FIG. 4) and/or method 510 (FIG. 5). Method 470 may be implemented in a computing device, computing system (e.g., hardware, configurable logic, fixed-function logic hardware, at least one computer readable storage medium comprising a set of instructions for execution, etc.).

FIG. 6A illustrates a decompressed buffer 200 and FIG. 6B illustrates a memory layout 250. At a time of machine model creation, examples (e.g., software and/or hardware based) may decide to prune weight matrices of machine learning model, or leave the weight matrices as is and then apply a compression (e.g., asymmetric numeral systems compression algorithm). Pruning may provide acceptable compression ratio results.

When configuring a semiconductor chip that includes a processing array to work on a given model, host software may copy the compressed weights and/or biases along with the corresponding metadata into on-chip memory (e.g., an on-chip SRAM and/or lower-level cache). Examples may also copy the data to an off-chip memory (e.g., DRAM). Once the compressed data has been copied to the on-chip memory, the machine learning model may begin to run by first loading the lookup tables using various instruction and then utilizing direct memory access instructions (referred to as data fetch request) when reading compressed weights. The direct memory access instructions may be supported by a direct memory access hardware block. Since such instructions are reading uncompressed data, the direct memory access hardware block may operate as a pass-through block. The direct memory access instructions may contain various fields such as the data and metadata base addresses, prefetch hints, etc. Each compressed chunk may be read in with individual direct memory access instructions.

At this point, the direct memory access block may operate to handle and read the compressed chunks. For a given compressed buffer, some chunks may be compressed while others are uncompressed. However, all chunks of a compressed buffer may have associated metadata (e.g., 4 bytes) and the chunks of compressed buffer are identified based on the metadata has been read that the chunks are uncompressed. Therefore initially a re-order buffer (ROB) slot may initially be occupied, but after reading the metadata and determining that a given chunk is actually uncompressed, the ROB slot may be deallocated for the given chunk. The ROB has entries/slots for multiple requests that track an instruction (e.g., direct memory access instructions) request throughout a life cycle of the instruction request and hold data associated with that request. The data beats come back out of order and are placed into the ROB. Once all beats are returned, the beats may be decompressed.

For a given compressed buffer, allowing some chunks to be compressed while still allowing other chunks to be uncompressed means that examples will still allocate metadata associated with the uncompressed chunks to allow for better packing of the data in cache (e.g., on-board memory). In some examples, all chunks will have some amount of compression, but due to some inherent algorithm overheads some chunks may be cheaper to store uncompressed.

The decompressed buffer 200 includes a plurality of 32×32 chunks. The uncompressed buffer occupies a significant amount of memory space. FIG. 6B illustrates a memory layout 250, and a memory layout for compressed chunks 252. As illustrated, the data offsets in the memory layout 250 is predictable at around every 1024 bytes. The data offsets in the memory layout for compressed chunks 252 is not predictable. The data offsets for the memory layout for compressed chunks 252 is provided in metadata.

Figure 7:
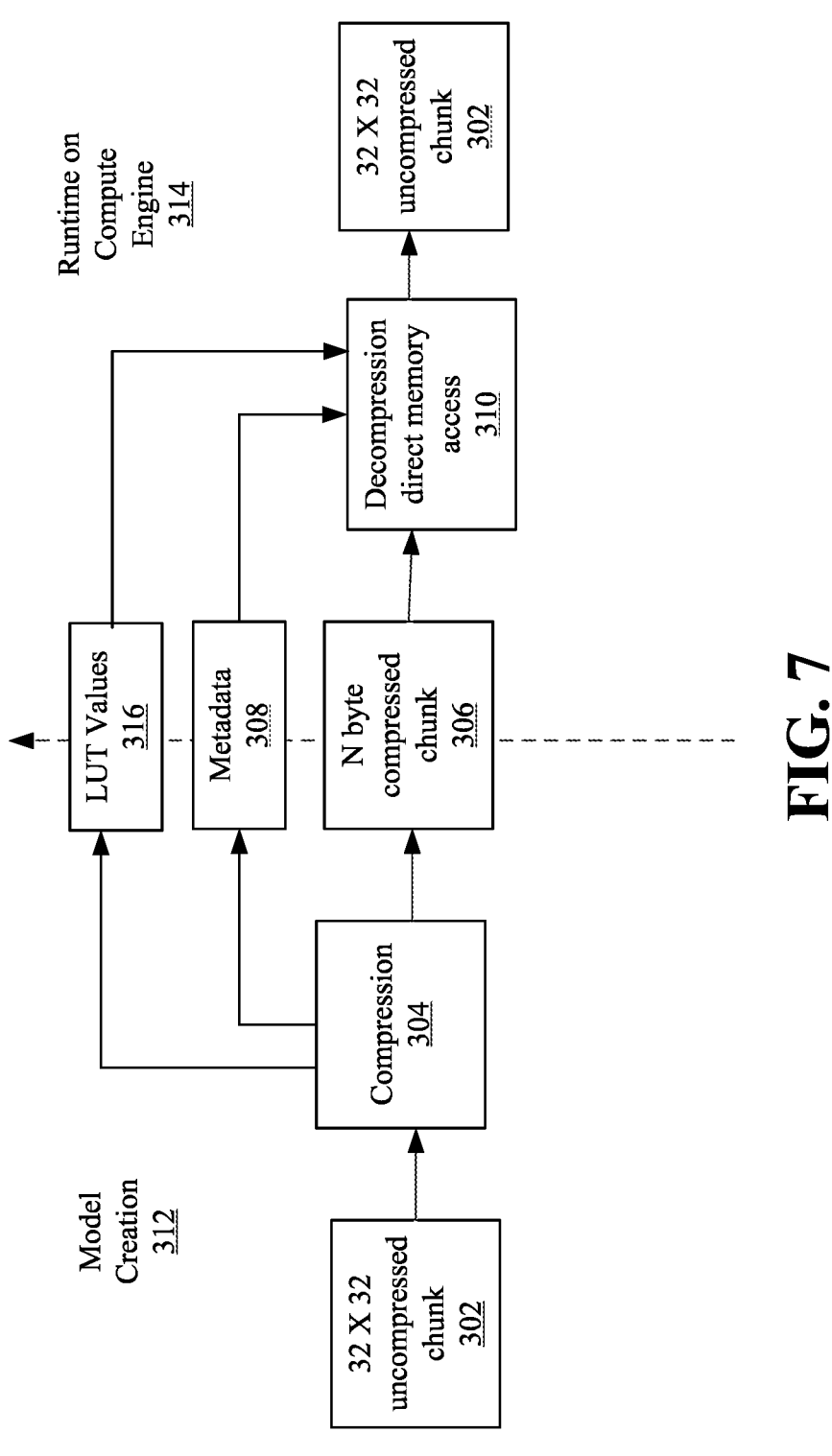
FIG. 7 illustrates a process of what each chunk goes through before being compressed according to an example of the disclosure.

FIG. 7 illustrates a process 300 of what each chunk goes through before being compressed, laid out and stored in memory, and after being read from memory. One or more aspects of the process 300 may be implemented as part of and/or in conjunction with the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), and/or the memory layout for compressed chunks 252 (FIG. 6B). Model creation 312 includes generating a 32×32 uncompressed chunk 302. Compression 304 then compresses the 32×32 uncompressed chunk 302. The compression 304 generates metadata 308 describing how the 32×32 uncompressed chunk 302 is compressed into the N byte compressed chunk 306, LUT and generates the N byte compressed chunk 306 based on the 32×32 uncompressed chunk 302. The N byte compressed chunk 306 may be stored in memory. During runtime on compute engine 314, a decompression direct memory access 310 decompresses the N byte compressed chunk 306 based on the metadata 308 to generate the original 32×32 uncompressed chunk 302.

Figure 8:
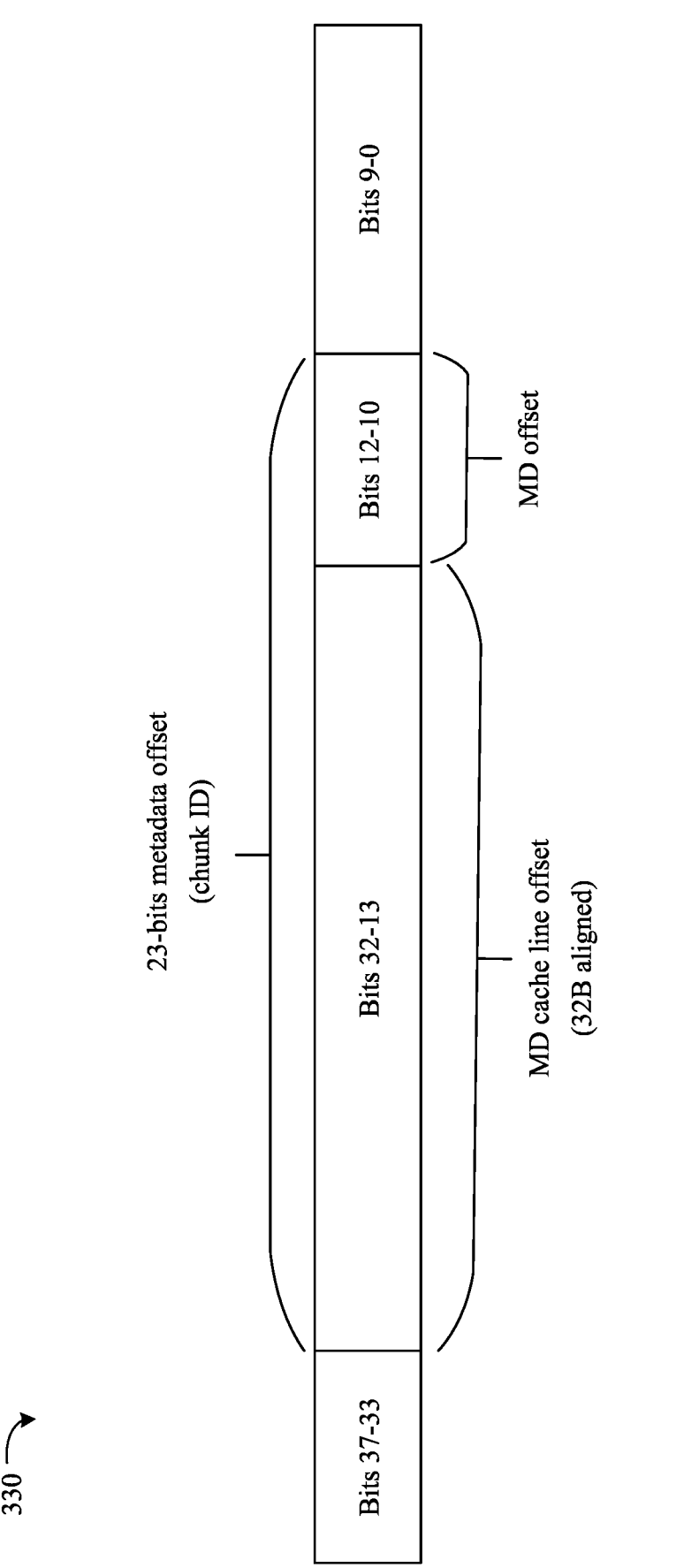
FIG. 8 illustrates a diagram showing the breakdown of an instruction or metadata according to an example of the disclosure.

FIG. 8 illustrates a diagram 330 showing how a field (e.g., the src_addr field specifically) coming in from a data fetch request instruction or metadata is broken down to identify which metadata to retrieve from memory. One or more aspects may be implemented as part of and/or in conjunction with the computing architecture 100 (FIG. 1), method 450

(FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B) and/or process 300 (FIG. 7).

Since the offset coming from the metadata is 23 bits (28 bits representing entire cache space minus 5 bits to make it 32B aligned), indicates at max there will only be 2^23 possible compressed chunks and therefore the chunk ID will also be 23 bits. The 23-bit feature of the metadata offset may be put into place by the common use case of the compressed chunks being placed in cache or on-chip memory; off-chip memory may be able to support much more than the number of chunks in the on-chip memory, but may be constrained by a 23-bit limitation. Since each metadata is 4B in order to determine the 32B address associated with the cache line which holds the metadata, the bottom or lower 3 bits (addr [12:10]) may be discarded. The remaining 20 bits (addr [32:13]) may be added to bits [38:5] of the source address in order to figure out the final address for the metadata. The source address is the address of a data chunk if the data chunk was sitting at a region starting at zero. The source address may be "data offset*" values for the left set of chunks of memory layout 250 (FIG. 6B). Before discarding the bottom 3 bits of the chunk ID, the 23 bit metadata address offset will go through a bit swap mechanism where any two bits of the 23 bits may be swapped with each other, as specified by the incoming instruction. The swapped output is added to the metadata base address to determine locations of the compressed data.

In some examples, a context is associated with a compressed buffer read. Each compressed buffer being read by software will consume a new context. Contexts are tracked in hardware via the base address coming from the instruction. When a new base address is detected for an incoming direct memory access instructions that means a new context may be consumed. There may be two direct memory access contexts, each with their own data base address. This is because the data base address comes as part of the incoming instruction and may be saved so when the ROB makes a data request, the ROB knows which data base address to use to determine the final data address. Hardware will keep track of what context a request uses in the ROB. If a new data base address is detected and there are ROB slots associated with current outstanding contexts the incoming request will be stalled until a context becomes inactive.

Figure 9A:
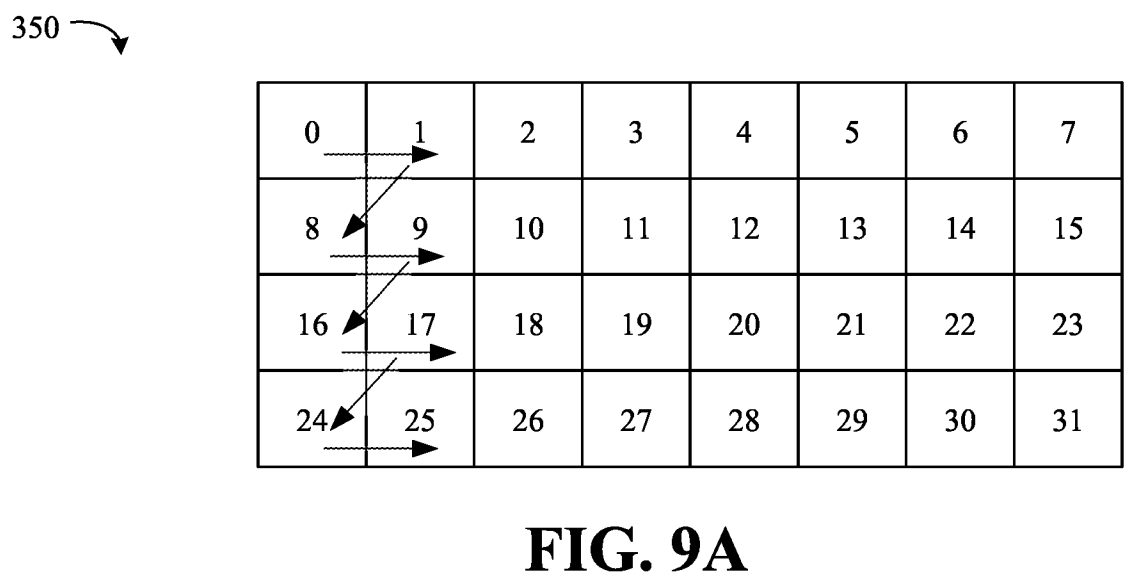

FIG. 9A illustrates a layout 350 of a compressed buffer that is being traversed in an example column major traversal pattern. One or more aspects of the layout 950 may be implemented as part of and/or in conjunction with the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), and/or diagram 330 (FIG. 8). Assuming 4B metadata, one way to obtain and determine metadata offset from the actual data offset (coming from the instruction) is to shift the data offset by 10 bits. Doing so provides the offset to the 4B metadata for the 1 KB of actual data. Some examples use 32B requests, and obtain 32B aligned offset by shifting the address offset by 13. The concern with such an approach is that for each cache line for metadata (assuming 32B cache lines for meta data storage), 8 metadata is generated and each of the metadata may be 256×32 region for the original matrix and/or buffer. There may be several cases where matrices are distributed to PEs in a column-wise fashion. In such cases, if a PE requests 32×256 of the buffer, only 12.5% of the metadata information will be utilized in the PE. This will result in cache thrashing and also potentially performance issues because of the increased metadata bandwidth.

One way to alleviate the above concern is to enable a way to programmatically swap address bits while calculating metadata offset. This swap will depend on the matrix size. Assuming a 1K×1K matrix size, if bits 15 and 12 of the actual data address offset are swapped, examples will obtain a 128×64 region of metadata in a 32B cache line. Doing so may lead to some level of underutilization for some buffers, but it will be much less than the brute force approach noted above. For examples, some examples may distribute 64×64 regions to PEs, and the worst case utilization will be 50% for most matrix sizes and will only happen for PEs where the buffer is distributed in a column-wise fashion. Bit swap may be programmable and swapping two bits may provide the operational data for most cases. For a 2-bit per chunk case, examples may not implement the above as the metadata is already significantly diminished.

For the bit swap feature to operate, examples should be aware that this feature may be enabled during run time and store the metadata in memory properly. Doing so is either compile time software which is generating the metadata in the first place or firmware at the time of copying the metadata into off-chip memory. This feature may be enabled at runtime if it is known that the compressed buffer will be traversed in a column wise fashion, otherwise if the compressed buffer is being traversed in row wise fashion then this feature (e.g., bit swap) may be disabled by setting both swap fields to the same value.

In FIG. 9A, an example with traversal with swap bits enabled is outlined as follows: Access to chunk0 (miss), Access to chunk1 (hit), Access to chunk8 (hit), Access to chunk9 (hit), Access to chunk16 (miss), Access to chunk17 (hit), Access to chunk24 (hit) and Access to chunk25 (hit).

FIG. 9B illustrates a layout 370 to store metadata in memory with no swap bit enabled. One or more aspects of layout 370 may be implemented as part of and/or in conjunction with the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8) and/or layout 350 (FIG. 9A). In this example, 32 chunks are illustrated with 8 metadata. In FIG. 9B, an example traversal without swap bits includes access to chunk0 (miss), access to chunk1 (hit), access to chunk8 (miss), access to chunk9 (hit), access to chunk16 (miss), access to chunk17 (hit), access to chunk24 (miss) and access to chunk25 (hit).

FIG. 9C illustrates layout 390 of metadata in memory with the swap bit enabled. In this example, 32 chunks are illustrated with 8 metadata. One or more aspects of layout 390 may be implemented as part of and/or in conjunction with the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8), layout 350 (FIG. 9A) and/or layout 370 (FIG. 9B).

Figure 10:
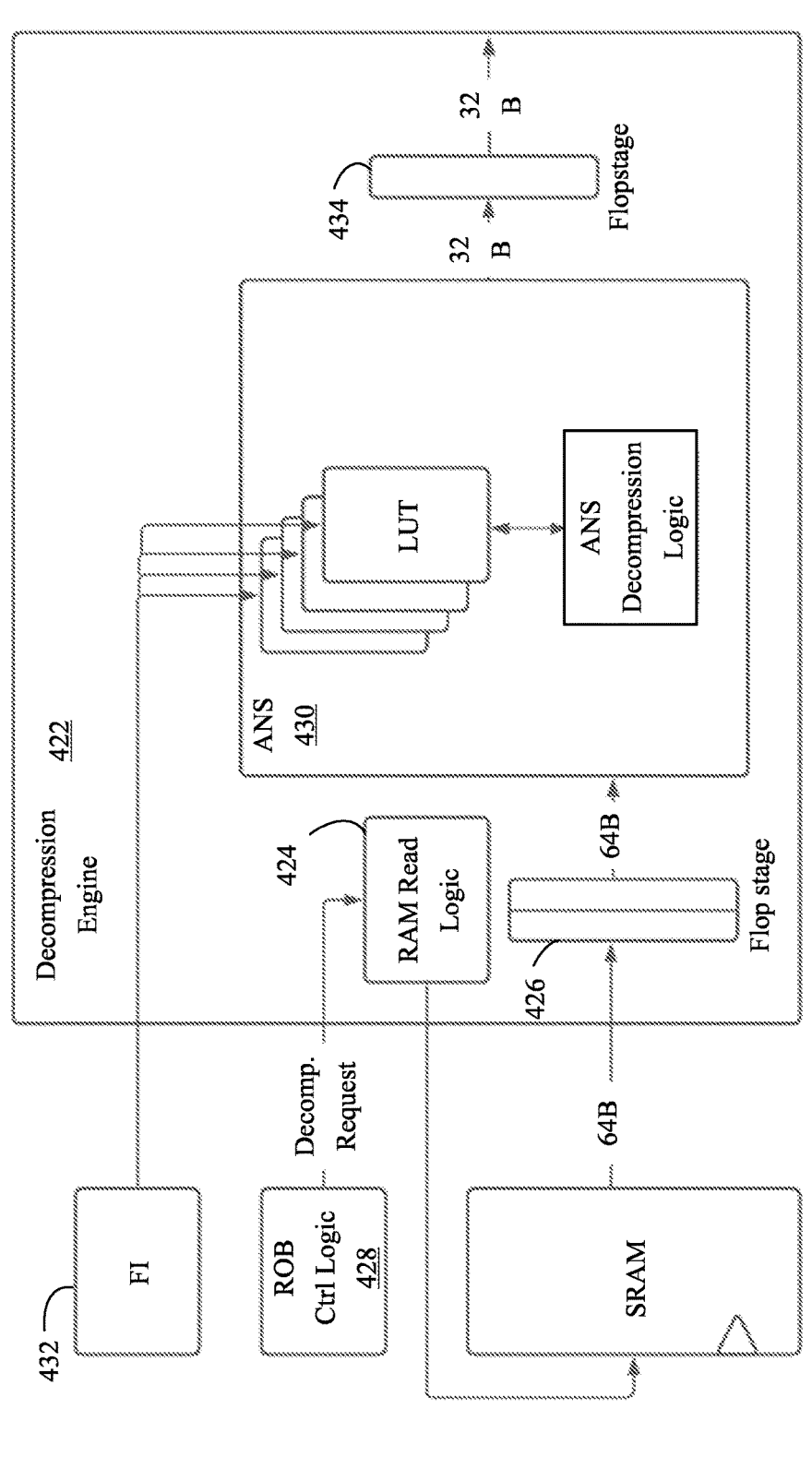
FIG. 10 illustrates a decompression architecture according to an example of the disclosure.

FIG. 10 illustrates a decompression architecture 420. The decompression engine 422 includes logic related to decompression. The logic includes the interface to the ROB accepting new requests, interface to the ROB random access memory (RAM) to send read requests, an interface to the ROB RAM to store the incoming read data, the ANS decompression logic, and finally the output data interface. One or more aspects of the decompression architecture 420 may be implemented as part of and/or in conjunction with the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8), layout 350 (FIG. 9A), layout 370 (FIG. 9B) and/or layout 390 (FIG. 9C).

The ROB control logic 428 will advertise the oldest ROB slot to have all of the beats returned. The RAM Read Logic 424 will take decompression requests from the ROB control logic 428 and begin issuing read requests to a corresponding RAM for the given slot. The read data will be placed into a flop stage 426. Since the incoming data may be left shifted before being used by the ANS 430, the flop stage 426 provides a full cycle for the shifting, since shifting directly after the RAM read might be difficult. Whether the flop stage 426 is a single stage or a double flop stage (e.g., with a registered ready) will depend on timing.

The data is then fed from the flop stage 426 to the ANS 430, where the data is left shifted depending on how much data was consumed in the previous cycle. After the ANS block has produced 32 8-bit elements, the 32 8-bit elements will be output to the top level direct memory access block where the 32 8-bit have to be arbitrated against data coming back from 432 (e.g., in the case of uncompressed data return). Therefore the output of the decompression engine 422 will be a flop stage 434 to be able to handle stalls properly.

Figure 11:
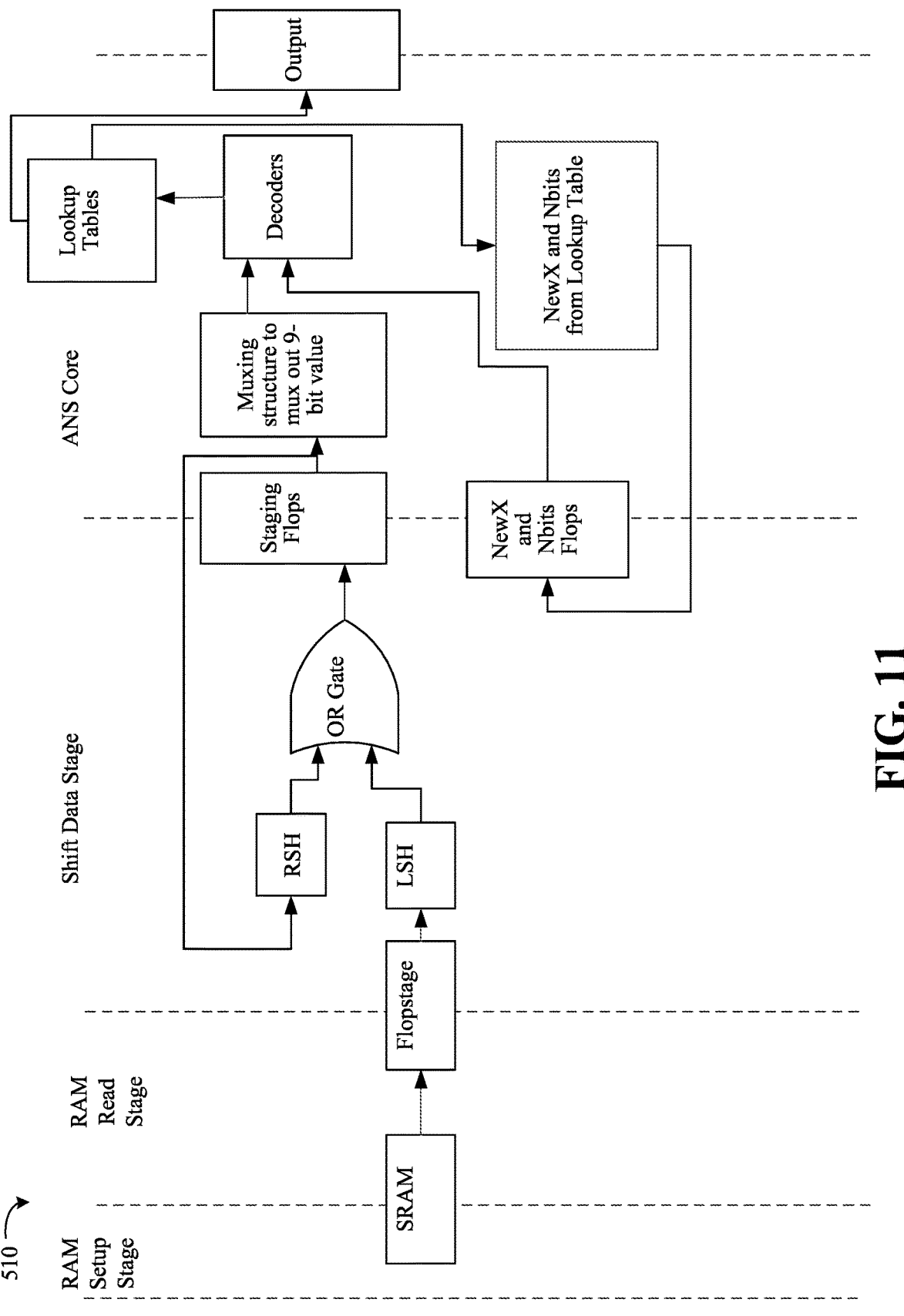
FIG. 11 illustrates a illustrates a high level decompression pipeline according to an example of the disclosure.

FIG. 11 illustrates a high level ANS decompression pipeline 510. The logic of the ANS core is considered the core ANS decompression logic. The ANS decompression pipeline 510 may have a 4 cycle latency (e.g., starting from the input of the SRAM to the uncompressed output) and may maintain a 32B/cycle throughput. One or more aspects of high level ANS decompression pipeline 510 may be implemented as part of and/or in conjunction with the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8), layout 350 (FIG. 9A), layout 370 (FIG. 9B), layout 390 (FIG. 9C) and/or decompression architecture 420 (FIG. 10).

System Overview

Figure 12:
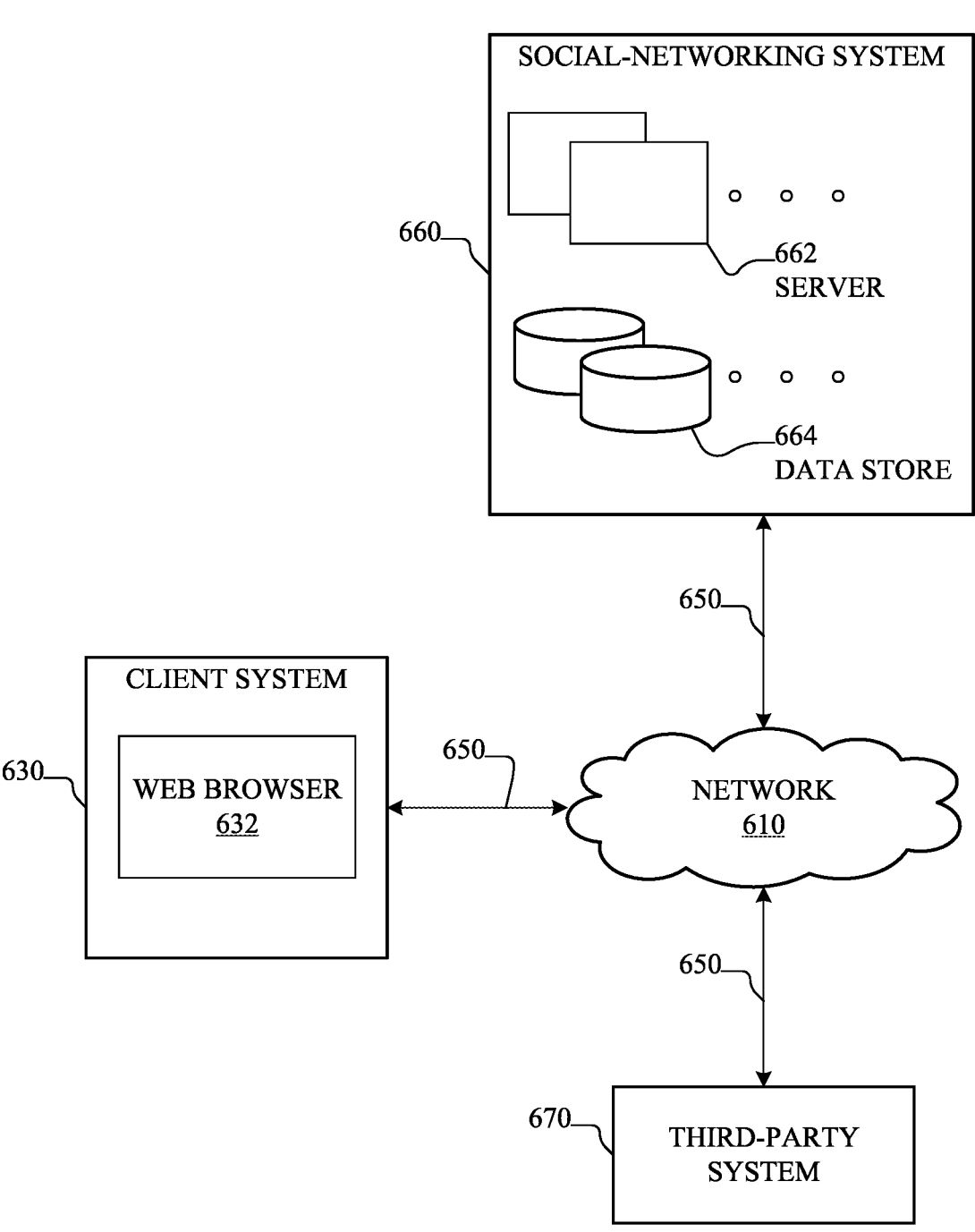
FIG. 12 illustrates an example network environment associated with a social-networking system according to an example of the disclosure.

FIG. 12 illustrates an example network environment 600 associated with a social-networking system. Network environment 600 may implement one or more aspects of the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8), layout 350 (FIG. 9A), layout 370 (FIG. 9B), layout 390 (FIG. 9C), decompression architecture 420 (FIG. 10) and/or high level ANS decompression pipeline 510 (FIG. 11) already discussed.

Network environment 600 includes a client system 630, a social-networking system 660, and a third-party system 670 connected to each other by a network 610. Although FIG. 12 illustrates a particular arrangement of client system 630, social-networking system 660, third-party system 670, and network 610, this disclosure contemplates any suitable arrangement of client system 630, social-networking system 660, third-party system 670, and network 610. As an example and not by way of limitation, two or more of client system 630, social-networking system 660, and third-party system 670 may be connected to each other directly, bypassing network 610. As another example, two or more of client system 630, social-networking system 660, and third-party system 670 may be physically or logically co-located with each other in whole or in part. Moreover, although FIG. 12 illustrates a particular number of client systems 630, social-networking systems 660, third-party systems 670, and networks 610, this disclosure contemplates any suitable number of client systems 630, social-networking systems 660, third-party systems 670, and networks 610. As an example and not by way of limitation, network environment 600 may include multiple client system 630, social-networking systems 660, third-party systems 670, and networks 610.

This disclosure contemplates any suitable network 610. As an example and not by way of limitation, one or more portions of network 610 may include an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, or a combination of two or more of these. Network 610 may include one or more networks 610.

Links 650 may connect client system 630, social-networking system 660, and third-party system 670 to communication network 610 or to each other. This disclosure contemplates any suitable links 650. In particular examples, one or more links 650 include one or more wireline (such as for example Digital Subscriber Line (DSL) or Data Over Cable Service Interface Specification (DOCSIS)), wireless (such as for example Wi-Fi or Worldwide Interoperability for Microwave Access (WiMAX)), or optical (such as for example Synchronous Optical Network (SONET) or Synchronous Digital Hierarchy (SDH)) links. In particular examples, one or more links 650 each include an ad hoc network, an intranet, an extranet, a VPN, a LAN, a WLAN, a WAN, a WWAN, a MAN, a portion of the Internet, a portion of the PSTN, a cellular technology-based network, a satellite communications technology-based network, another link 650, or a combination of two or more such links 650. Links 650 may not necessarily be the same throughout network environment 600. One or more first links 650 may differ in one or more respects from one or more second links 650.

In particular examples, client system 630 may be an electronic device including hardware, software, or embedded logic components or a combination of two or more such components and capable of carrying out the appropriate functionalities implemented or supported by client system 630. As an example and not by way of limitation, a client system 630 may include a computer system such as a desktop computer, notebook or laptop computer, netbook, a tablet computer, e-book reader, GPS device, camera, personal digital assistant (PDA), handheld electronic device, cellular telephone, smartphone, augmented/virtual reality device, other suitable electronic device, or any suitable combination thereof. This disclosure contemplates any suitable client systems 630. A client system 630 may enable a network user at client system 630 to access network 610. A client system 630 may enable its user to communicate with other users at other client systems 630.

In particular examples, client system 630 may include a web browser 632, such as MICROSOFT INTERNET EXPLORER, GOOGLE CHROME or MOZILLA FIREFOX, and may have one or more add-ons, plug-ins, or other extensions, such as TOOLBAR or YAHOO TOOLBAR. A user at client system 630 may enter a Uniform Resource Locator (URL) or other address directing the web browser 632 to a particular server (such as server 662, or a server associated with a third-party system 670), and the web browser 632 may generate a Hyper Text Transfer Protocol (HTTP) request and communicate the HTTP request to server. The server may accept the HTTP request and communicate to client system 630 one or more Hyper Text Markup Language (HTML) files responsive to the HTTP request. Client system 630 may render a webpage based on the HTML files from the server for presentation to the user. This disclosure contemplates any suitable webpage files. As an example and not by way of limitation, webpages may render from HTML files, Extensible Hyper Text Markup Language (XHTML) files, or Extensible Markup Language (XML) files, according to particular desires. Such pages may also execute scripts such as, for example and without limitation, those written in JAVASCRIPT, JAVA, MICROSOFT SILVERLIGHT, combinations of markup language and scripts such as AJAX (Asynchronous JAVASCRIPT and XML), and the like. Herein, reference to a webpage encompasses one or more corresponding webpage files (which a browser may use to render the webpage) and vice versa, where appropriate.

In particular examples, social-networking system 660 may be a network-addressable computing system that may host an online social network. Social-networking system 660 may generate, store, receive, and send social-networking data, such as, for example, user-profile data, concept-profile data, social-graph information, or other suitable data related to the online social network. Social-networking system 660 may be accessed by the other components of network environment 600 either directly or via network 610. As an example and not by way of limitation, client system 630 may access social-networking system 660 using a web browser 632, or a native application associated with social-networking system 660 (e.g., a mobile social-networking application, a messaging application, another suitable application, or any combination thereof) either directly or via network 610. In particular examples, social-networking system 660 may include one or more servers 662. Each server 662 may be a unitary server or a distributed server spanning multiple computers or multiple datacenters. Servers 662 may be of various types, such as, for example and without limitation, web server, news server, mail server, message server, advertising server, file server, application server, exchange server, database server, proxy server, another server suitable for performing functions or processes described herein, or any combination thereof. In particular examples, each server 662 may include hardware, software, or embedded logic components or a combination of two or more such components for carrying out the appropriate functionalities implemented or supported by server 662. In particular examples, social-networking system 660 may include one or more data stores 664. Data stores 664 may be used to store various types of information. In particular examples, the information stored in data stores 664 may be organized according to specific data structures. In particular examples, each data store 664 may be a relational, columnar, correlation, or other suitable database. Although this disclosure describes or illustrates particular types of databases, this disclosure contemplates any suitable types of databases.

Particular examples may provide interfaces that enable a client system 630, a social-networking system 660, or a third-party system 670 to manage, retrieve, modify, add, or delete, the information stored in data store 664.

In particular examples, social-networking system 660 may store one or more social graphs in one or more data stores 664. In particular examples, a social graph may include multiple nodes-which may include multiple user nodes (each corresponding to a particular user) or multiple concept nodes (each corresponding to a particular concept)—and multiple edges connecting the nodes. Social-networking system 660 may provide users of the online social network the ability to communicate and interact with other users. In particular examples, users may join the online social network via social-networking system 660 and then add connections (e.g., relationships) to a number of other users of social-networking system 660 to whom they want to be connected. Herein, the term "friend" may refer to any other user of social-networking system 660 with whom a user has formed a connection, association, or relationship via social-networking system 660.

In particular examples, social-networking system 660 may provide users with the ability to take actions on various types of items or objects, supported by social-networking system 660. As an example and not by way of limitation, the items and objects may include groups or social networks to which users of social-networking system 660 may belong, events or calendar entries in which a user might be interested, computer-based applications that a user may use, transactions that allow users to buy or sell items via the service, interactions with advertisements that a user may perform, or other suitable items or objects. A user may interact with anything that is capable of being represented in social-networking system 660 or by an external system of third-party system 670, which is separate from social-networking system 660 and coupled to social-networking system 660 via a network 610.

In particular examples, social-networking system 660 may be capable of linking a variety of entities. As an example and not by way of limitation, social-networking system 660 may enable users to interact with each other as well as receive content from third-party systems 670 or other entities, or to allow users to interact with these entities through an application programming interfaces (API) or other communication channels.

In particular examples, a third-party system 670 may include one or more types of servers, one or more data stores, one or more interfaces, including but not limited to APIs, one or more web services, one or more content sources, one or more networks, or any other suitable components, e.g., that servers may communicate with. A third-party system 670 may be operated by a different entity from an entity operating social-networking system 660. In particular examples, however, social-networking system 660 and third-party systems 670 may operate in conjunction with each other to provide social-networking services to users of social-networking system 660 or third-party systems 670. In this sense, social-networking system 660 may provide a platform, or backbone, which other systems, such as third-party systems 670, may use to provide social-networking services and functionality to users across the Internet.

In particular examples, a third-party system 670 may include a third-party content object provider. A third-party content object provider may include one or more sources of content objects, which may be communicated to a client system 630. As an example and not by way of limitation, content objects may include information regarding things or activities of interest to the user, such as, for example, movie show times, movie reviews, restaurant reviews, restaurant menus, product information and reviews, or other suitable information. As another example and not by way of limitation, content objects may include incentive content objects, such as coupons, discount tickets, gift certificates, or other suitable incentive objects.

In particular examples, social-networking system 660 also includes user-generated content objects, which may enhance a user's interactions with social-networking system 660. User-generated content may include anything a user may add, upload, send, or "post" to social-networking system 660. As an example and not by way of limitation, a user communicates posts to social-networking system 660 from a client system 630. Posts may include data such as status updates or other textual data, location information, photos, videos, links, music or other similar data or media. Content may also be added to social-networking system 660 by a third-party through a "communication channel," such as a newsfeed or stream.

In particular examples, social-networking system 660 may include a variety of servers, sub-systems, programs, modules, logs, and data stores. In particular examples, social-networking system 660 may include one or more of the following: a web server, action logger, API-request server, relevance-and-ranking engine, content-object classifier, notification controller, action log, third-party-content-object-exposure log, inference module, authorization/privacy server, search module, advertisement-targeting module, user-interface module, user-profile store, connection store, third-party content store, or location store. Social-networking system 660 may also include suitable components such as network interfaces, security mechanisms, load balancers, failover servers, management-and-network-operations consoles, other suitable components, or any suitable combination thereof. In particular examples, social-networking system 660 may include one or more user-profile stores for storing user profiles. A user profile may include, for example, biographic information, demographic information, behavioral information, social information, or other types of descriptive information, such as work experience, educational history, hobbies or preferences, interests, affinities, or location. Interest information may include interests related to one or more categories. Categories may be general or specific. As an example and not by way of limitation, if a user "likes" an article about a brand of shoes the category may be the brand, or the general category of "shoes" or "clothing." A connection store may be used for storing connection information about users. The connection information may indicate users who have similar or common work experience, group memberships, hobbies, educational history, or are in any way related or share common attributes. The connection information may also include user-defined connections between different users and content (both internal and external). A web server may be used for linking social-networking system 660 to one or more client systems 630 or one or more third-party system 670 via network 610. The web server may include a mail server or other messaging functionality for receiving and routing messages between social-networking system 660 and one or more client systems 630. An API-request server may allow a third-party system 670 to access information from social-networking system 660 by calling one or more APIs. An action logger may be used to receive communications from a web server about a user's actions on or off social-networking system 660. In conjunction with the action log, a third-party-content-object log may be maintained of user exposures to third-party-content objects. A notification controller may provide information regarding content objects to a client system 630. Information may be pushed to a client system 630 as notifications, or information may be pulled from client system 630 responsive to a request received from client system 630. Authorization servers may be used to enforce one or more privacy settings of the users of social-networking system 660. A privacy setting of a user determines how particular information associated with a user may be shared. The authorization server may allow users to opt in to or opt out of having their actions logged by social-networking system 660 or shared with other systems (e.g., third-party system 670), such as, for example, by setting appropriate privacy settings. Third-party-content-object stores may be used to store content objects received from third parties, such as a third-party system 670. Location stores may be used for storing location information received from client systems 630 associated with users. Advertisement-pricing modules may combine social information, the current time, location information, or other suitable information to provide relevant advertisements, in the form of notifications, to a user.

Social Graphs

Figure 13:
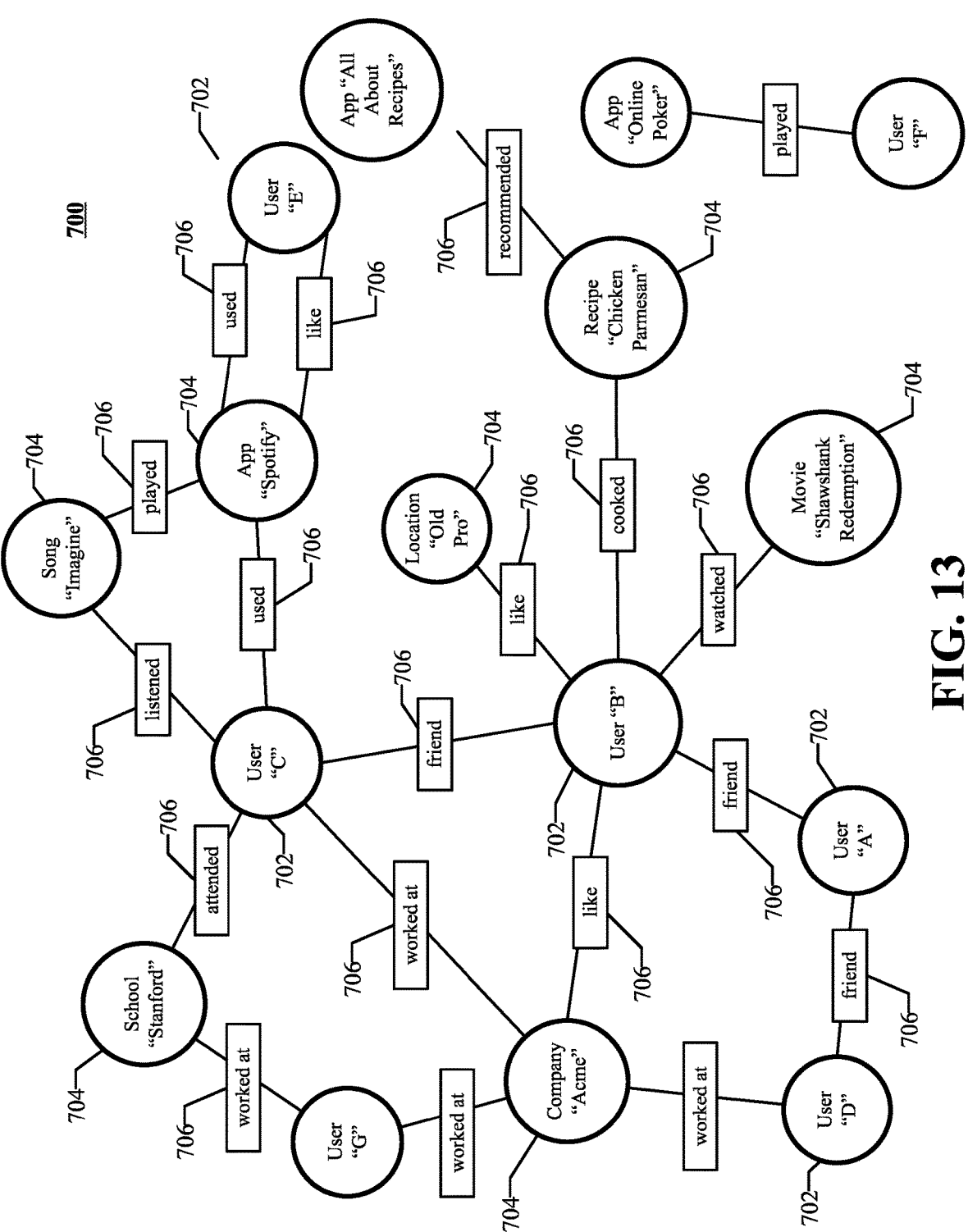
FIG. 13 illustrates an example social graph according to an example of the disclosure.

FIG. 13 illustrates example social graph 700. In some examples, the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8), layout 350 (FIG. 9A), layout 370 (FIG. 9B), layout 390 (FIG. 9C), decompression architecture 420 (FIG. 10) and/or high level ANS decompression pipeline 510 (FIG. 11) already discussed may access social graph 700 to implement one or more aspects. In particular examples, social-networking system 660 may store one or more social graphs 700 in one or more data stores. In particular examples, social graph 700 may include multiple nodes—which may include multiple user nodes 702 or multiple concept nodes 704—and multiple edges 706 connecting the nodes. Each node may be associated with a unique entity (i.e., user or concept), each of which may have a unique identifier (ID), such as a unique number or username. Example social graph 700 illustrated in FIG. 13 is shown, for didactic purposes, in a two-dimensional visual map representation. In particular examples, a social-networking system 660, client system 630, or third-party system 670 may access social graph 700 and related social-graph information for suitable applications. The nodes and edges of social graph 700 may be stored as data objects, for example, in a data store (such as a social-graph database). Such a data store may include one or more searchable or queryable indexes of nodes or edges of social graph 700.

In particular examples, a user node 702 may correspond to a user of social-networking system 660. As an example and not by way of limitation, a user may be an individual (human user), an entity (e.g., an enterprise, business, or third-party application), or a group (e.g., of individuals or entities) that interacts or communicates with or over social-networking system 660. In particular examples, when a user registers for an account with social-networking system 660, social-networking system 660 may create a user node 702 corresponding to the user, and store the user node 702 in one or more data stores. Users and user nodes 702 described herein may, where appropriate, refer to registered users and user nodes 702 associated with registered users. In addition or as an alternative, users and user nodes 702 described herein may, where appropriate, refer to users that have not registered with social-networking system 660. In particular examples, a user node 702 may be associated with information provided by a user or information gathered by various systems, including social-networking system 660. As an example and not by way of limitation, a user may provide his or her name, profile picture, contact information, birth date, sex, marital status, family status, employment, education background, preferences, interests, or other demographic information. In particular examples, a user node 702 may be associated with one or more data objects corresponding to information associated with a user. In particular examples, a user node 702 may correspond to one or more webpages.

In particular examples, a concept node 704 may correspond to a concept. As an example and not by way of limitation, a concept may correspond to a place (such as, for example, a movie theater, restaurant, landmark, or city); a website (such as, for example, a website associated with social-network system 660 or a third-party website associated with a web-application server); an entity (such as, for example, a person, business, group, sports team, or celebrity); a resource (such as, for example, an audio file, video file, digital photo, text file, structured document, or application) which may be located within social-networking system 660 or on an external server, such as a web-application server; real or intellectual property (such as, for example, a sculpture, painting, movie, game, song, idea, photograph, or written work); a game; an activity; an idea or theory; an object in a augmented/virtual reality environment; another suitable concept; or two or more such concepts. A concept node 704 may be associated with information of a concept provided by a user or information gathered by various systems, including social-networking system 660. As an example and not by way of limitation, information of a concept may include a name or a title; one or more images (e.g., an image of the cover page of a book); a location (e.g., an address or a geographical location); a website (which may be associated with a URL); contact information (e.g., a phone number or an email address); other suitable concept information; or any suitable combination of such information. In particular examples, a concept node 704 may be associated with one or more data objects corresponding to information associated with concept node 704. In particular examples, a concept node 704 may correspond to one or more webpages.

In particular examples, a node in social graph 700 may represent or be represented by a webpage (which may be referred to as a "profile page"). Profile pages may be hosted by or accessible to social-networking system 660. Profile pages may also be hosted on third-party websites associated with a third-party system 670. As an example and not by way of limitation, a profile page corresponding to a particular external webpage may be the particular external webpage and the profile page may correspond to a particular concept node 704. Profile pages may be viewable by all or a selected subset of other users. As an example and not by way of limitation, a user node 702 may have a corresponding user-profile page in which the corresponding user may add content, make declarations, or otherwise express himself or herself. As another example and not by way of limitation, a concept node 704 may have a corresponding concept-profile page in which one or more users may add content, make declarations, or express themselves, particularly in relation to the concept corresponding to concept node 704.

In particular examples, a concept node 704 may represent a third-party webpage or resource hosted by a third-party system 670. The third-party webpage or resource may include, among other elements, content, a selectable or other icon, or other inter-actable object (which may be implemented, for example, in JavaScript, AJAX, or PHP codes) representing an action or activity. As an example and not by way of limitation, a third-party webpage may include a selectable icon such as "like," "check-in," "eat," "recommend," or another suitable action or activity. A user viewing the third-party webpage may perform an action by selecting one of the icons (e.g., "check-in"), causing a client system 630 to send to social-networking system 660 a message indicating the user's action. In response to the message, social-networking system 660 may create an edge (e.g., a check-in-type edge) between a user node 702 corresponding to the user and a concept node 704 corresponding to the third-party webpage or resource and store edge 706 in one or more data stores.

In particular examples, a pair of nodes in social graph 700 may be connected to each other by one or more edges 706. An edge 706 connecting a pair of nodes may represent a relationship between the pair of nodes. In particular examples, an edge 706 may include or represent one or more data objects or attributes corresponding to the relationship between a pair of nodes. As an example and not by way of limitation, a first user may indicate that a second user is a "friend" of the first user. In response to this indication, social-networking system 660 may send a "friend request" to the second user. If the second user confirms the "friend request," social-networking system 660 may create an edge 706 connecting the first user's user node 702 to the second user's user node 702 in social graph 700 and store edge 706 as social-graph information in one or more of data stores 664. In the example of FIG. 13, social graph 700 includes an edge 706 indicating a friend relation between user nodes 702 of user "A" and user "B" and an edge indicating a friend relation between user nodes 702 of user "C" and user "B." Although this disclosure describes or illustrates particular edges 706 with particular attributes connecting particular user nodes 702, this disclosure contemplates any suitable edges 706 with any suitable attributes connecting user nodes 702. As an example and not by way of limitation, an edge 706 may represent a friendship, family relationship, business or employment relationship, fan relationship (including, e.g., liking, etc.), follower relationship, visitor relationship (including, e.g., accessing, viewing, checking-in, sharing, etc.), subscriber relationship, superior/subordinate relationship, reciprocal relationship, non-reciprocal relationship, another suitable type of relationship, or two or more such relationships. Moreover, although this disclosure generally describes nodes as being connected, this disclosure also describes users or concepts as being connected. Herein, references to users or concepts being connected may, where appropriate, refer to the nodes corresponding to those users or concepts being connected in social graph 700 by one or more edges 706. The degree of separation between two objects represented by two nodes, respectively, is a count of edges in a shortest path connecting the two nodes in the social graph 700. As an example and not by way of limitation, in the social graph 700, the user node 702 of user "C" is connected to the user node 702 of user "A" via multiple paths including, for example, a first path directly passing through the user node 702 of user "B," a second path passing through the concept node 704 of company "Acme" and the user node 702 of user "D," and a third path passing through the user nodes 702 and concept nodes 704 representing school "Stanford," user "G," company "Acme," and user "D." User "C" and user "A" have a degree of separation of two because the shortest path connecting their corresponding nodes (i.e., the first path) includes two edges 706.

In particular examples, an edge 706 between a user node 702 and a concept node 704 may represent a particular action or activity performed by a user associated with user node 702 toward a concept associated with a concept node 704. As an example and not by way of limitation, as illustrated in FIG. 13, a user may "like," "attended," "played," "listened," "cooked," "worked at," or "watched" a concept, each of which may correspond to an edge type or subtype. A concept-profile page corresponding to a concept node 704 may include, for example, a selectable "check in" icon (such as, for example, a clickable "check in" icon) or a selectable "add to favorites" icon. Similarly, after a user clicks these icons, social-networking system 660 may create a "favorite" edge or a "check in" edge in response to a user's action corresponding to a respective action. As another example and not by way of limitation, a user (user "C") may listen to a particular song ("Imagine") using a particular application (SPOTIFY, which is an online music application). In this case, social-networking system 660 may create a "listened" edge 706 and a "used" edge (as illustrated in FIG. 12) between user nodes 702 corresponding to the user and concept nodes 704 corresponding to the song and application to indicate that the user listened to the song and used the application. Moreover, social-networking system 660 may create a "played" edge 706 (as illustrated in FIG. 13) between concept nodes 704 corresponding to the song and the application to indicate that the particular song was played by the particular application. In this case, "played" edge 706 corresponds to an action performed by an external application (SPOTIFY) on an external audio file (the song "Imagine"). Although this disclosure describes particular edges 706 with particular attributes connecting user nodes 702 and concept nodes 704, this disclosure contemplates any suitable edges 706 with any suitable attributes connecting user nodes 702 and concept nodes 704. Moreover, although this disclosure describes edges between a user node 702 and a concept node 704 representing a single relationship, this disclosure contemplates edges between a user node 702 and a concept node 704 representing one or more relationships. As an example and not by way of limitation, an edge 706 may represent both that a user likes and has used at a particular concept. Alternatively, another edge 706 may represent each type of relationship (or multiples of a single relationship) between a user node 702 and a concept node 704 (as illustrated in FIG. 13 between user node 702 for user "E" and concept node 704 for "SPOTIFY").

In particular examples, social-networking system 660 may create an edge 706 between a user node 702 and a concept node 704 in social graph 700. As an example and not by way of limitation, a user viewing a concept-profile page (such as, for example, by using a web browser or a special-purpose application hosted by the user's client system 630) may indicate that he or she likes the concept represented by the concept node 704 by clicking or selecting a "Like" icon, which may cause the user's client system 630 to send to social-networking system 660 a message indicating the user's liking of the concept associated with the concept-profile page. In response to the message, social-networking system 660 may create an edge 706 between user node 702 associated with the user and concept node 704, as illustrated by "like" edge 706 between the user and concept node 704. In particular examples, social-networking system 660 may store an edge 706 in one or more data stores. In particular examples, an edge 706 may be automatically formed by social-networking system 660 in response to a particular user action. As an example and not by way of limitation, if a first user uploads a picture, watches a movie, or listens to a song, an edge 706 may be formed between user node 702 corresponding to the first user and concept nodes 704 corresponding to those concepts. Although this disclosure describes forming particular edges 706 in particular manners, this disclosure contemplates forming any suitable edges 706 in any suitable manner.

Social Graph Affinity and Coefficient

In particular examples, social-networking system 660 may determine the social-graph affinity (which may be referred to herein as "affinity") of various social-graph entities for each other. Affinity may represent the strength of a relationship or level of interest between particular objects associated with the online social network, such as users, concepts, content, actions, advertisements, other objects associated with the online social network, or any suitable combination thereof. Affinity may also be determined with respect to objects associated with third-party systems 670 or other suitable systems. An overall affinity for a social-graph entity for each user, subject matter, or type of content may be established. The overall affinity may change based on continued monitoring of the actions or relationships associated with the social-graph entity. Although this disclosure describes determining particular affinities in a particular manner, this disclosure contemplates determining any suitable affinities in any suitable manner.

In particular examples, social-networking system 660 may measure or quantify social-graph affinity using an affinity coefficient (which may be referred to herein as "coefficient"). The coefficient may represent or quantify the strength of a relationship between particular objects associated with the online social network. The coefficient may also represent a probability or function that measures a predicted probability that a user will perform a particular action based on the user's interest in the action. In this way, a user's future actions may be predicted based on the user's prior actions, where the coefficient may be calculated at least in part on the history of the user's actions. Coefficients may be used to predict any number of actions, which may be within or outside of the online social network. As an example and not by way of limitation, these actions may include various types of communications, such as sending messages, posting content, or commenting on content; various types of observation actions, such as accessing or viewing profile pages, media, or other suitable content; various types of coincidence information about two or more social-graph entities, such as being in the same group, tagged in the same photograph, checked-in at the same location, or attending the same event; or other suitable actions. Although this disclosure describes measuring affinity in a particular manner, this disclosure contemplates measuring affinity in any suitable manner.

In particular examples, social-networking system 660 may use a variety of factors to calculate a coefficient. These factors may include, for example, user actions, types of relationships between objects, location information, other suitable factors, or any combination thereof. In particular examples, different factors may be weighted differently when calculating the coefficient. The weights for each factor may be static or the weights may change according to, for example, the user, the type of relationship, the type of action, the user's location, and so forth. Ratings for the factors may be combined according to their weights to determine an overall coefficient for the user. As an example and not by way of limitation, particular user actions may be assigned both a rating and a weight while a relationship associated with the particular user action is assigned a rating and a correlating weight (e.g., so the weights total 100%). To calculate the coefficient of a user towards a particular object, the rating assigned to the user's actions may comprise, for example, 60% of the overall coefficient, while the relationship between the user and the object may comprise 40% of the overall coefficient. In particular examples, the social-networking system 660 may consider a variety of variables when determining weights for various factors used to calculate a coefficient, such as, for example, the time since information was accessed, decay factors, frequency of access, relationship to information or relationship to the object about which information was accessed, relationship to social-graph entities connected to the object, short- or long-term averages of user actions, user feedback, other suitable variables, or any combination thereof. As an example and not by way of limitation, a coefficient may include a decay factor that causes the strength of the signal provided by particular actions to decay with time, such that more recent actions are more relevant when calculating the coefficient. The ratings and weights may be continuously updated based on continued tracking of the actions upon which the coefficient is based. Any type of process or algorithm may be employed for assigning, combining, averaging, and so forth the ratings for each factor and the weights assigned to the factors. In particular examples, social-networking system 660 may determine coefficients using machine-learning algorithms trained on historical actions and past user responses, or data farmed from users by exposing them to various options and measuring responses. Although this disclosure describes calculating coefficients in a particular manner, this disclosure contemplates calculating coefficients in any suitable manner.

In particular examples, social-networking system 660 may calculate a coefficient based on a user's actions. Social-networking system 660 may monitor such actions on the online social network, on a third-party system 670, on other suitable systems, or any combination thereof. Any suitable type of user actions may be tracked or monitored. Typical user actions include viewing profile pages, creating or posting content, interacting with content, tagging or being tagged in images, joining groups, listing and confirming attendance at events, checking-in at locations, liking particular pages, creating pages, and performing other tasks that facilitate social action. In particular examples, social-networking system 660 may calculate a coefficient based on the user's actions with particular types of content. The content may be associated with the online social network, a third-party system 670, or another suitable system. The content may include users, profile pages, posts, news stories, headlines, instant messages, chat room conversations, emails, advertisements, pictures, video, music, other suitable objects, or any combination thereof. Social-networking system 660 may analyze a user's actions to determine whether one or more of the actions indicate an affinity for subject matter, content, other users, and so forth. As an example and not by way of limitation, if a user frequently posts content related to "coffee" or variants thereof, social-networking system 660 may determine the user has a high coefficient with respect to the concept "coffee". Particular actions or types of actions may be assigned a higher weight and/or rating than other actions, which may affect the overall calculated coefficient. As an example and not by way of limitation, if a first user emails a second user, the weight or the rating for the action may be higher than if the first user simply views the user-profile page for the second user.

In particular examples, social-networking system 660 may calculate a coefficient based on the type of relationship between particular objects. Referencing the social graph 700, social-networking system 660 may analyze the number and/or type of edges 706 connecting particular user nodes 702 and concept nodes 704 when calculating a coefficient. As an example and not by way of limitation, user nodes 702 that are connected by a spouse-type edge (representing that the two users are married) may be assigned a higher coefficient than user nodes 702 that are connected by a friend-type edge. In other words, depending upon the weights assigned to the actions and relationships for the particular user, the overall affinity may be determined to be higher for content about the user's spouse than for content about the user's friend. In particular examples, the relationships a user has with another object may affect the weights and/or the ratings of the user's actions with respect to calculating the coefficient for that object. As an example and not by way of limitation, if a user is tagged in a first photo, but merely likes a second photo, social-networking system 660 may determine that the user has a higher coefficient with respect to the first photo than the second photo because having a tagged-in-type relationship with content may be assigned a higher weight and/or rating than having a like-type relationship with content. In particular examples, social-networking system 660 may calculate a coefficient for a first user based on the relationship one or more second users have with a particular object. In other words, the connections and coefficients other users have with an object may affect the first user's coefficient for the object. As an example and not by way of limitation, if a first user is connected to or has a high coefficient for one or more second users, and those second users are connected to or have a high coefficient for a particular object, social-networking system 660 may determine that the first user should also have a relatively high coefficient for the particular object. In particular examples, the coefficient may be based on the degree of separation between particular objects. The lower coefficient may represent the decreasing likelihood that the first user will share an interest in content objects of the user that is indirectly connected to the first user in the social graph 700. As an example and not by way of limitation, social-graph entities that are closer in the social graph 700 (i.e., fewer degrees of separation) may have a higher coefficient than entities that are further apart in the social graph 700.

In particular examples, social-networking system 660 may calculate a coefficient based on location information. Objects that are geographically closer to each other may be considered to be more related or of more interest to each other than more distant objects. In particular examples, the coefficient of a user towards a particular object may be based on the proximity of the object's location to a current location associated with the user (or the location of a client system 630 of the user). A first user may be more interested in other users or concepts that are closer to the first user. As an example and not by way of limitation, if a user is one mile from an airport and two miles from a gas station, social-networking system 660 may determine that the user has a higher coefficient for the airport than the gas station based on the proximity of the airport to the user.

In particular examples, social-networking system 660 may perform particular actions with respect to a user based on coefficient information. Coefficients may be used to predict whether a user will perform a particular action based on the user's interest in the action. A coefficient may be used when generating or presenting any type of objects to a user, such as advertisements, search results, news stories, media, messages, notifications, or other suitable objects. The coefficient may also be utilized to rank and order such objects, as appropriate. In this way, social-networking system 660 may provide information that is relevant to user's interests and current circumstances, increasing the likelihood that they will find such information of interest. In particular examples, social-networking system 660 may generate content based on coefficient information. Content objects may be provided or selected based on coefficients specific to a user. As an example and not by way of limitation, the coefficient may be used to generate media for the user, where the user may be presented with media for which the user has a high overall coefficient with respect to the media object. As another example and not by way of limitation, the coefficient may be used to generate advertisements for the user, where the user may be presented with advertisements for which the user has a high overall coefficient with respect to the advertised object. In particular examples, social-networking system 660 may generate search results based on coefficient information. Search results for a particular user may be scored or ranked based on the coefficient associated with the search results with respect to the querying user. As an example and not by way of limitation, search results corresponding to objects with higher coefficients may be ranked higher on a search-results page than results corresponding to objects having lower coefficients.

In particular examples, social-networking system 660 may calculate a coefficient in response to a request for a coefficient from a particular system or process. To predict the likely actions a user may take (or may be the subject of) in a given situation, any process may request a calculated coefficient for a user. The request may also include a set of weights to use for various factors used to calculate the coefficient. This request may come from a process running on the online social network, from a third-party system 670 (e.g., via an API or other communication channel), or from another suitable system. In response to the request, social-networking system 660 may calculate the coefficient (or access the coefficient information if it has previously been calculated and stored). In particular examples, social-networking system 660 may measure an affinity with respect to a particular process. Different processes (both internal and external to the online social network) may request a coefficient for a particular object or set of objects. Social-networking system 660 may provide a measure of affinity that is relevant to the particular process that requested the measure of affinity. In this way, each process receives a measure of affinity that is tailored for the different context in which the process will use the measure of affinity.

In connection with social-graph affinity and affinity coefficients, particular examples may utilize one or more systems, components, elements, functions, methods, operations, or steps disclosed in U.S. patent application Ser. No. 11/503,093, filed 11 Aug. 2006, U.S. patent application Ser. No. 12/977,027, filed 22 Dec. 2010, U.S. patent application Ser. No. 12/978,265, filed 23 Dec. 2010, and U.S. patent application Ser. No. 13/632,869, filed 1 Oct. 2012, each of which is incorporated by reference.

Privacy

In particular examples, one or more of the content objects of the online social network may be associated with a privacy setting. The privacy settings (or "access settings")

for an object may be stored in any suitable manner, such as, for example, in association with the object, in an index on an authorization server, in another suitable manner, or any combination thereof. A privacy setting of an object may specify how the object (or particular information associated with an object) may be accessed (e.g., viewed or shared) using the online social network. Where the privacy settings for an object allow a particular user to access that object, the object may be described as being "visible" with respect to that user. As an example and not by way of limitation, a user of the online social network may specify privacy settings for a user-profile page that identify a set of users that may access the work experience information on the user-profile page, thus excluding other users from accessing the information. In particular examples, the privacy settings may specify a "blocked list" of users that should not be allowed to access certain information associated with the object. In other words, the blocked list may specify one or more users or entities for which an object is not visible. As an example and not by way of limitation, a user may specify a set of users that may not access photos albums associated with the user, thus excluding those users from accessing the photo albums (while also possibly allowing certain users not within the set of users to access the photo albums). In particular examples, privacy settings may be associated with particular social-graph elements. Privacy settings of a social-graph element, such as a node or an edge, may specify how the social-graph element, information associated with the social-graph element, or content objects associated with the social-graph element may be accessed using the online social network. As an example and not by way of limitation, a particular concept node 704 corresponding to a particular photo may have a privacy setting specifying that the photo may be accessed by users tagged in the photo and their friends. In particular examples, privacy settings may allow users to opt in or opt out of having their actions logged by social-networking system 660 or shared with other systems (e.g., third-party system 670). In particular examples, the privacy settings associated with an object may specify any suitable granularity of permitted access or denial of access. As an example and not by way of limitation, access or denial of access may be specified for particular users (e.g., me, my roommates, and my boss), users within a particular degrees-of-separation (e.g., friends, or friends-of-friends), user groups (e.g., the gaming club, my family), user networks (e.g., employees of particular employers, students or alumni of particular university), all users ("public"), no users ("private"), users of third-party systems 670, particular applications (e.g., third-party applications, external websites), other suitable users or entities, or any combination thereof. Although this disclosure describes using particular privacy settings in a particular manner, this disclosure contemplates using any suitable privacy settings in any suitable manner.

In particular examples, one or more servers 662 may be authorization/privacy servers for enforcing privacy settings. In response to a request from a user (or other entity) for a particular object stored in a data store 664, social-networking system 660 may send a request to the data store 664 for the object. The request may identify the user associated with the request and may be sent to the user (or a client system 630 of the user) if the authorization server determines that the user is authorized to access the object based on the privacy settings associated with the object. If the requesting user is not authorized to access the object, the authorization server may prevent the requested object from being retrieved from the data store 664, or may prevent the requested object from being sent to the user. In the search query context, an object may be generated as a search result if the querying user is authorized to access the object. In other words, the object may have a visibility that is visible to the querying user. If the object has a visibility that is not visible to the user, the object may be excluded from the search results. Although this disclosure describes enforcing privacy settings in a particular manner, this disclosure contemplates enforcing privacy settings in any suitable manner.

Systems and Methods

Figure 14:
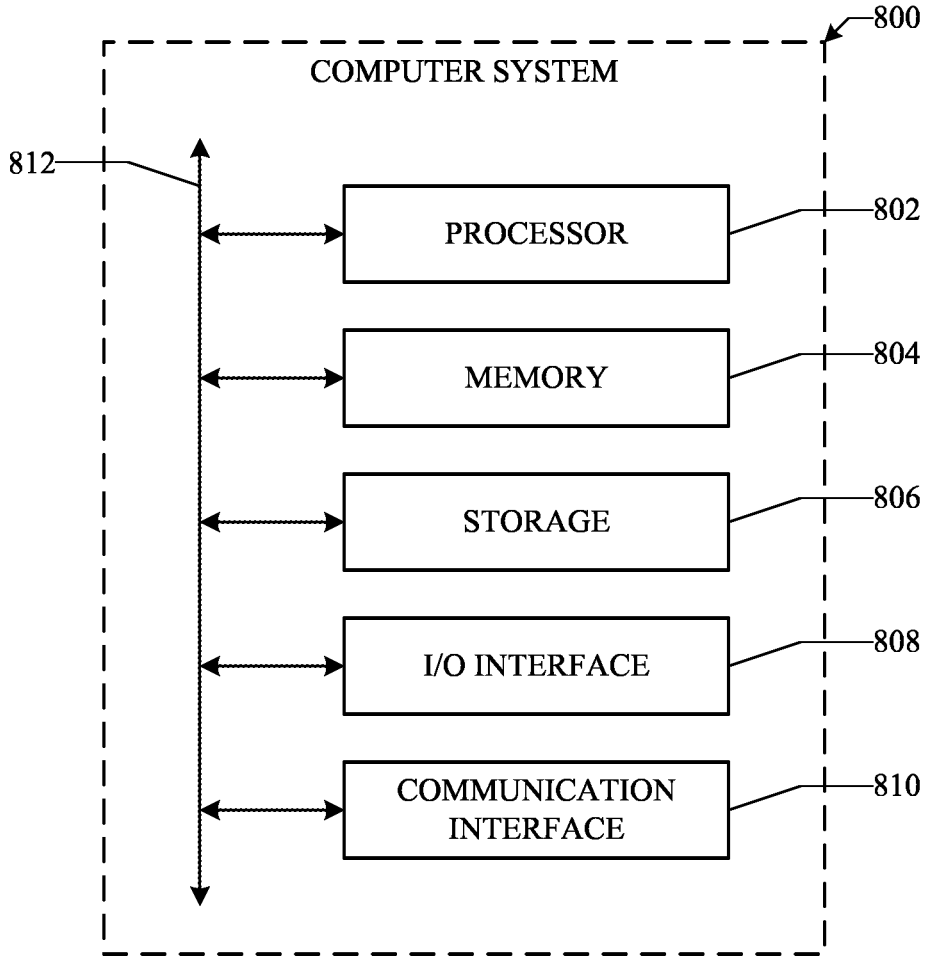
FIG. 14 illustrates an example computer system according to an example of the disclosure.

FIG. 14 illustrates an example computer system 800. The system 800 may implement one or more aspects of the computing architecture 100 (FIG. 1), method 450 (FIG. 2), method 470 (FIG. 3), method 470 (FIG. 4), method 510 (FIG. 5), the decompressed buffer 200 (FIG. 6A), the memory layout 250 (FIG. 6B), the memory layout for compressed chunks 252 (FIG. 6B), process 300 (FIG. 7), diagram 330 (FIG. 8), layout 350 (FIG. 9A), layout 370 (FIG. 9B), layout 390 (FIG. 9C), decompression architecture 420 (FIG. 10) and/or high level ANS decompression pipeline 510 (FIG. 11). In particular examples, one or more computer systems 800 perform one or more steps of one or more methods described or illustrated herein. In particular examples, one or more computer systems 800 provide functionality described or illustrated herein. In particular examples, software running on one or more computer systems 800 performs one or more steps of one or more methods described or illustrated herein or provides functionality described or illustrated herein. Particular examples include one or more portions of one or more computer systems 800. Herein, reference to a computer system may encompass a computing device, and vice versa, where appropriate. Moreover, reference to a computer system may encompass one or more computer systems, where appropriate.

This disclosure contemplates any suitable number of computer systems 800. This disclosure contemplates computer system 800 taking any suitable physical form. As example and not by way of limitation, computer system 800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 800 may include one or more computer systems 800; be unitary or distributed; span multiple locations; span multiple machines; span multiple data centers; or reside in a cloud, which may include one or more cloud components in one or more networks. Where appropriate, one or more computer systems 800 may perform without substantial spatial or temporal limitation one or more steps of one or more methods described or illustrated herein. As an example and not by way of limitation, one or more computer systems 800 may perform in real time or in batch mode one or more steps of one or more methods described or illustrated herein. One or more computer systems 800 may perform at different times or at different locations one or more steps of one or more methods described or illustrated herein, where appropriate.

In particular examples, computer system 800 includes a processor 802, memory 804, storage 806, an input/output (I/O) interface 808, a communication interface 810, and a bus 812. Although this disclosure describes and illustrates a particular computer system having a particular number of particular components in a particular arrangement, this disclosure contemplates any suitable computer system having any suitable number of any suitable components in any suitable arrangement.

In particular examples, processor 802 includes hardware for executing instructions, such as those making up a computer program. As an example and not by way of limitation, to execute instructions, processor 802 may retrieve (or fetch) the instructions from an internal register, an internal cache, memory 804, or storage 806; decode and execute them; and then write one or more results to an internal register, an internal cache, memory 804, or storage 806. In particular examples, processor 802 may include one or more internal caches for data, instructions, or addresses. This disclosure contemplates processor 802 including any suitable number of any suitable internal caches, where appropriate. As an example and not by way of limitation, processor 802 may include one or more instruction caches, one or more data caches, and one or more translation lookaside buffers (TLBs). Instructions in the instruction caches may be copies of instructions in memory 804 or storage 806, and the instruction caches may speed up retrieval of those instructions by processor 802. Data in the data caches may be copies of data in memory 804 or storage 806 for instructions executing at processor 802 to operate on; the results of previous instructions executed at processor 802 for access by subsequent instructions executing at processor 802 or for writing to memory 804 or storage 806; or other suitable data. The data caches may speed up read or write operations by processor 802. The TLBs may speed up virtual-address translation for processor 802. In particular examples, processor 802 may include one or more internal registers for data, instructions, or addresses. This disclosure contemplates processor 802 including any suitable number of any suitable internal registers, where appropriate. Where appropriate, processor 802 may include one or more arithmetic logic units (ALUs); be a multi-core processor; or include one or more processors 802. Although this disclosure describes and illustrates a particular processor, this disclosure contemplates any suitable processor.

In particular examples, memory 804 includes main memory for storing instructions for processor 802 to execute or data for processor 802 to operate on. As an example and not by way of limitation, computer system 800 may load instructions from storage 806 or another source (such as, for example, another computer system 800) to memory 804. Processor 802 may then load the instructions from memory 804 to an internal register or internal cache. To execute the instructions, processor 802 may retrieve the instructions from the internal register or internal cache and decode them. During or after execution of the instructions, processor 802 may write one or more results (which may be intermediate or final results) to the internal register or internal cache. Processor 802 may then write one or more of those results to memory 804. In particular examples, processor 802 executes instructions in one or more internal registers or internal caches or in memory 804 (as opposed to storage 806 or elsewhere) and operates on data in one or more internal registers or internal caches or in memory 804 (as opposed to storage 806 or elsewhere). One or more memory buses (which may each include an address bus and a data bus) may couple processor 802 to memory 804. Bus 812 may include one or more memory buses, as described below. In particular examples, one or more memory management units (MMUs) reside between processor 802 and memory 804 and facilitate accesses to memory 804 requested by processor 802. In particular examples, memory 804 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 804 may include one or more memories 804, where appropriate. Although this disclosure describes and illustrates particular memory, this disclosure contemplates any suitable memory.

In particular examples, storage 806 includes mass storage for data or instructions. As an example and not by way of limitation, storage 806 may include a hard disk drive (HDD), a floppy disk drive, flash memory, an optical disc, a magneto-optical disc, magnetic tape, or a Universal Serial Bus (USB) drive or a combination of two or more of these. Storage 806 may include removable or non-removable (or fixed) media, where appropriate. Storage 806 may be internal or external to computer system 800, where appropriate. In particular examples, storage 806 is non-volatile, solid-state memory. In particular examples, storage 806 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 806 taking any suitable physical form. Storage 806 may include one or more storage control units facilitating communication between processor 802 and storage 806, where appropriate. Where appropriate, storage 806 may include one or more storages 806. Although this disclosure describes and illustrates particular storage, this disclosure contemplates any suitable storage.

In particular examples, I/O interface 808 includes hardware, software, or both, providing one or more interfaces for communication between computer system 800 and one or more I/O devices. Computer system 800 may include one or more of these I/O devices, where appropriate. One or more of these I/O devices may enable communication between a person and computer system 800. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 808 for them. Where appropriate, I/O interface 808 may include one or more device or software drivers enabling processor 802 to drive one or more of these I/O devices. I/O interface 808 may include one or more I/O interfaces 808, where appropriate. Although this disclosure describes and illustrates a particular I/O interface, this disclosure contemplates any suitable I/O interface.

In particular examples, communication interface 810 includes hardware, software, or both providing one or more interfaces for communication (such as, for example, packet-based communication) between computer system 800 and one or more other computer systems 800 or one or more networks. As an example and not by way of limitation, communication interface 810 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 810 for it. As an example and not by way of limitation, computer system 800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 800 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 800 may include any suitable communication interface 810 for any of these networks, where appropriate. Communication interface 810 may include one or more communication interfaces 810, where appropriate. Although this disclosure describes and illustrates a particular communication interface, this disclosure contemplates any suitable communication interface.

In particular examples, bus 812 includes hardware, software, or both coupling components of computer system 800 to each other. As an example and not by way of limitation, bus 812 may include an Accelerated Graphics Port (AGP) or other graphics bus, an Enhanced Industry Standard Architecture (EISA) bus, a front-side bus (FSB), a HYPER-TRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 812 may include one or more buses 812, where appropriate. Although this disclosure describes and illustrates a particular bus, this disclosure contemplates any suitable bus or interconnect.

Examples

Example 1 includes at least one computer readable storage medium comprising a set of instructions, which when executed by a computing device, cause the computing device to compress first data based on a first compression scheme to generate second data, where the first data is associated with a first machine learning model, store the second data into a memory, adjust a first entry of a lookup table to correspond to the first compression scheme based on the first data being compressed based on the first compression scheme, provide the second data from the memory to processing elements of a processing array during execution of the first machine learning model, and decompress, at the processing array, the second data based on the lookup table to obtain the first data.

Example 2 includes the at least one computer readable storage medium of Example 1, where the instructions, when executed, cause the computing device to compress third data based on a second compression scheme to generate fourth data, where the third data is associated with a second machine learning model, store the fourth data into the memory, adjust a second entry of the lookup table to correspond to the second compression scheme based on the third data being compressed based on the second compression scheme, provide the third data from the memory to the processing array during execution of the second machine learning model, and decompress, at the processing array, the fourth data based on the lookup table to obtain the third data.

Example 3 includes the at least one computer readable storage medium of Example 2, where the instructions, when executed, cause the computing device to replace the first entry in the lookup table with the second entry.

Example 4 includes the at least one computer readable storage medium of Example 2, where the instructions, when executed, cause the computing device to insert the second entry into the lookup table so that the lookup table includes the first entry and the second entry.

Example 5 includes the at least one computer readable storage medium of Example 1, where the instructions, when executed, cause the computing device to identify that a first portion of the first data is compressible by an amount based on the first compression scheme, and determine that the first portion is to be compressed with the first compression scheme based on the amount meeting a compression threshold.

Example 6 includes the at least one computer readable storage medium of Example 1, where the instructions, when executed, cause the computing device to determine that compression of the first data with the first compression scheme reduces a size of the first data to be less than or equal to an available memory space of the memory, predict that the first compression scheme is to be applied at least a first number of times, determine that the at least the first number of times meets a reuse threshold, select the first compression scheme based on the at least the first number of times meeting the reuse threshold, and compression of the first data with the first compression scheme reducing the size of the first data to be less than or equal to the available memory space, generate metadata to associate the first compression scheme with the second data, and store the second data in association with the metadata into the memory.

Example 7 includes the at least one computer readable storage medium of any one of Examples 1 to 6, where the first data includes one or more of weights or biases, the first compression scheme is an Asymmetric Numeral Systems compression scheme, the first data is to be compressed based on the first compression scheme prior to the first machine model being executed, and to decompress the second data, the processing array is to decompress the second data with the processing elements.

Example 8 includes a system comprising one or more processors, and a first memory coupled to the one or more processors, the first memory comprising instructions executable by the one or more processors, the one or more processors being operable when executing the instructions to compress first data based on a first compression scheme to generate second data, where the first data is associated with a first machine learning model, store the second data into a second memory, adjust a first entry of a lookup table to correspond to the first compression scheme based on the first data being compressed based on the first compression scheme, provide the second data from the second memory to processing elements of a processing array during execution of the first machine learning model, and decompress, at the processing array, the second data based on the lookup table to obtain the first data.

Example 9 includes the system of Example 8, where the one or more processors are further operable when executing the instructions to compress third data based on a second compression scheme to generate fourth data, where the third data is associated with a second machine learning model, store the fourth data into the second memory, adjust a second entry of the lookup table to correspond to the second compression scheme based on the third data being compressed based on the second compression scheme, provide the third data from the second memory to the processing array during execution of the second machine learning model, and decompress, at the processing array, the fourth data based on the lookup table to obtain the third data.

Example 10 includes the system of Example 9, where the one or more processors are further operable when executing the instructions to replace the first entry in the lookup table with the second entry.

Example 11 includes the system of Example 9, where the one or more processors are further operable when executing the instructions to insert the second entry into the lookup table so that the lookup table includes the first entry and the second entry.

Example 12 includes the system of Example 8, where the one or more processors are further operable when executing the instructions to identify that a first portion of the first data is compressible by an amount based on the first compression scheme, and determine that the first portion is to be compressed with the first compression scheme based on the amount meeting a compression threshold.

Example 13 includes the system of Example 8, where the one or more processors are further operable when executing the instructions to determine that compression of the first data with the first compression scheme reduces a size of the first data to be less than or equal to an available memory space of the second memory, predict that the first compression scheme is to be applied at least a first number of times, determine that the at least the first number of times meets a reuse threshold, select the first compression scheme based on the at least the first number of times meeting the reuse threshold, and compression of the first data with the first compression scheme reducing the size of the first data to be less than or equal to the available memory space, generate metadata to associate the first compression scheme with the second data, and store the second data in association with the metadata into the second memory.

Example 14 includes the system of any one of Examples 8 to 13, where the first data includes one or more of weights or biases, the first compression scheme is an Asymmetric Numeral Systems compression scheme, the first data is to be compressed based on the first compression scheme prior to the first machine model being executed, and to decompress the second data, the processing array is to decompress the second data with the processing elements.

Example 15 includes a method comprising compressing first data based on a first compression scheme to generate second data, where the first data is associated with a first machine learning model, storing the second data into a memory, adjusting a first entry of a lookup table to correspond to the first compression scheme based on the first data being compressed based on the first compression scheme, providing the second data from the memory to processing elements of a processing array during execution of the first machine learning model, and decompressing, at the processing array, the second data based on the lookup table to obtain the first data.

Example 16 includes the method of Example 15, further comprising compressing third data based on a second compression scheme to generate fourth data, where the third data is associated with a second machine learning model, storing the fourth data into the memory, adjusting a second entry of the lookup table to correspond to the second compression scheme based on the third data being compressed based on the second compression scheme, providing the third data from the memory to the processing array during execution of the second machine learning model, and decompressing, at the processing array, the fourth data based on the lookup table to obtain the third data.

Example 17 includes the method of Example 16, further comprising replacing the first entry in the lookup table with the second entry.

Example 18 includes the method of Example 16, further comprising inserting the second entry into the lookup table so that the lookup table includes the first entry and the second entry.

Example 19 includes the method of Example 15, further comprising identifying that a first portion of the first data is compressible by an amount based on the first compression scheme, and determining that the first portion is to be compressed with the first compression scheme based on the amount meeting a compression threshold.

Example 20 includes the method of any one of Examples 15 to 19, further comprising determining that compression of the first data with the first compression scheme reduces a size of the first data to be less than or equal to an available memory space of the memory, predicting that the first compression scheme is to be applied at least a first number of times, determining that the at least the first number of times meets a reuse threshold, selecting the first compression scheme based on the at least the first number of times meeting the reuse threshold, and compression of the first data with the first compression scheme reducing the size of the first data to be less than or equal to the available memory space, generating metadata to associate the first compression scheme with the second data, and storing the second data in association with the metadata into the memory, where the first data includes one or more of weights or biases, the first compression scheme is an Asymmetric Numeral Systems compression scheme, the first data is to be compressed based on the first compression scheme prior to the first machine model being executed, and to decompress the second data, the processing array is to decompress the second data with the processing elements.

Example 21 includes a system comprising means for compressing first data based on a first compression scheme to generate second data, where the first data is associated with a first machine learning model, means for storing the second data into a memory, means for adjusting a first entry of a lookup table to correspond to the first compression scheme based on the first data being compressed based on the first compression scheme, means for providing the second data from the memory to processing elements of a processing array during execution of the first machine learning model, and means for decompressing, at the processing array, the second data based on the lookup table to obtain the first data.

Example 22 includes the system of Example 21, further comprising means for compressing third data based on a second compression scheme to generate fourth data, where the third data is associated with a second machine learning model, means for storing the fourth data into the memory, means for adjusting a second entry of the lookup table to correspond to the second compression scheme based on the third data being compressed based on the second compression scheme, means for providing the third data from the memory to the processing array during execution of the second machine learning model, and means for decompressing, at the processing array, the fourth data based on the lookup table to obtain the third data.

Example 23 includes the system of Example 22, further comprising means for replacing the first entry in the lookup table with the second entry.

Example 24 includes the system of Example 22, further comprising means for inserting the second entry into the lookup table so that the lookup table includes the first entry and the second entry.

Example 25 includes the system of Example 21, further comprising means for identifying that a first portion of the first data is compressible by an amount based on the first compression scheme, and means for determining that the first portion is to be compressed with the first compression scheme based on the amount meeting a compression threshold.

Example 26 includes the system of Example 21, further comprising means for determining that compression of the first data with the first compression scheme reduces a size of the first data to be less than or equal to an available memory space of the memory, means for predicting that the first compression scheme is to be applied at least a first number of times, means for determining that the at least the first number of times meets a reuse threshold, means for selecting the first compression scheme based on the at least the first number of times meeting the reuse threshold, and compression of the first data with the first compression scheme reducing the size of the first data to be less than or equal to the available memory space, means for generating metadata to associate the first compression scheme with the second data, and means for storing the second data in association with the metadata into the memory.

Example 27 includes any one of the apparatuses of Examples 21 to 26, where the first data includes one or more of weights or biases, the first compression scheme is an Asymmetric Numeral Systems compression scheme, the first data is to be compressed based on the first compression scheme prior to the first machine model being executed, and to decompress the second data, the processing array is to decompress the second data with the processing elements.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Examples are applicable for use with all types of semiconductor integrated circuit ("IC") chips. Examples of these IC chips include but are not limited to processors, controllers, chipset components, programmable logic arrays (PLAs), memory chips, network chips, systems on chip (SOCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary examples to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although examples are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the examples. Further, arrangements may be shown in block diagram form in order to avoid obscuring examples, and also in view of the fact that specifics with respect to implementation of such block diagram arrangements are highly dependent upon the computing system within which the example is to be implemented, i.e., such specifics should be well within purview of one skilled in the art. Where specific details (e.g., circuits) are set forth in order to describe example examples, it should be apparent to one skilled in the art that examples may be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the examples may be implemented in a variety of forms. Therefore, while the examples have been described in connection with particular examples thereof, the true scope of the examples should not be so limited since other modifications will become apparent to the skilled practitioner upon a study of the drawings, specification, and following claims.

We claim:

1. At least one non-transitory computer readable storage medium comprising a set of instructions, which when executed by a computing device, cause the computing device to:

compress first data based on a first compression scheme to generate second data, wherein the first data is associated with a first machine learning model;

store the second data into a memory;

adjust a first entry of a lookup table to correspond to the first compression scheme based on the first data being compressed based on the first compression scheme;

provide the second data from the memory to processing elements of a processing array during execution of the first machine learning model; and decompress, at the processing array, the second data based on the lookup table to obtain the first data;

wherein: the first data includes one or more of weights or biases; the first compression scheme is an Asymmetric Numeral Systems compression scheme; the first data is to be compressed based on the first compression scheme prior to the first machine model being executed; and to decompress the second data, the processing array is to decompress the second data with the processing elements, wherein the instructions, when executed, cause the computing device to:

determine that compression of the first data with the first compression scheme reduces a size of the first data to be less than or equal to an available memory space of the memory;

predict that the first compression scheme is to be applied at least a first number of times;

determine that the at least the first number of times meets a reuse threshold;

select the first compression scheme based on the at least the first number of times meeting the reuse threshold, and compression of the first data with the first compression scheme reducing the size of the first data to be less than or equal to the available memory space;

generate metadata to associate the first compression scheme with the second data; and store the second data in association with the metadata into the memory.

2. The at least one non-transitory computer readable storage medium of claim 1, wherein the instructions, when executed, cause the computing device to:

compress third data based on a second compression scheme to generate fourth data, wherein the third data is associated with a second machine learning model;

store the fourth data into the memory;

adjust a second entry of the lookup table to correspond to the second compression scheme based on the third data being compressed based on the second compression scheme;

provide the third data from the memory to the processing array during execution of the second machine learning model; and decompress, at the processing array, the fourth data based on the lookup table to obtain the third data.

3. The at least one non-transitory computer readable storage medium of claim 2, wherein the instructions, when executed, cause the computing device to:

replace the first entry in the lookup table with the second entry.

4. The at least one non-transitory computer readable storage medium of claim 2, wherein the instructions, when executed, cause the computing device to:

insert the second entry into the lookup table so that the lookup table includes the first entry and the second entry.

5. The at least one non-transitory computer readable storage medium of claim 1, wherein the instructions, when executed, cause the computing device to:

identify that a first portion of the first data is compressible by an amount based on the first compression scheme; and determine that the first portion is to be compressed with the first compression scheme based on the amount meeting a compression threshold.

6. A system comprising:

one or more processors; and first memory coupled to the one or more processors, the first memory comprising instructions executable by the one or more processors, the one or more processors being operable when executing the instructions to:

compress first data based on a first compression scheme to generate second data, wherein the first data is associated with a first machine learning model;

store the second data into a second memory;

adjust a first entry of a lookup table to correspond to the first compression scheme based on the first data being compressed based on the first compression scheme;

provide the second data from the second memory to processing elements of a processing array during execution of the first machine learning model;

decompress, at the processing array, the second data based on the lookup table to obtain the first data;

determine that compression of the first data with the first compression scheme reduces a size of the first data to be less than or equal to an available memory space of the second memory;

predict that the first compression scheme is to be applied at least a first number of times;

determine that the at least the first number of times meets a reuse threshold;

select the first compression scheme based on the at least the first number of times meeting the reuse threshold, and compression of the first data with the first compression scheme reducing the size of the first data to be less than or equal to the available memory space;

generate metadata to associate the first compression scheme with the second data; and store the second data in association with the metadata into the second memory.

7. The system of claim 6, wherein the one or more processors are further operable when executing the instructions to:

compress third data based on a second compression scheme to generate fourth data, wherein the third data is associated with a second machine learning model;

store the fourth data into the second memory;

adjust a second entry of the lookup table to correspond to the second compression scheme based on the third data being compressed based on the second compression scheme;

provide the third data from the second memory to the processing array during execution of the second machine learning model; and decompress, at the processing array, the fourth data based on the lookup table to obtain the third data.

8. The system of claim 7, wherein the one or more processors are further operable when executing the instructions to:

replace the first entry in the lookup table with the second entry.

9. The system of claim 7, wherein the one or more processors are further operable when executing the instructions to:

insert the second entry into the lookup table so that the lookup table includes the first entry and the second entry.

10. The system of claim 6, wherein the one or more processors are further operable when executing the instructions to:

identify that a first portion of the first data is compressible by an amount based on the first compression scheme; and determine that the first portion is to be compressed with the first compression scheme based on the amount meeting a compression threshold.

11. The system of claim 6, wherein:

the first data includes one or more of weights or biases;

the first compression scheme is an Asymmetric Numeral Systems compression scheme;

the first data is to be compressed based on the first compression scheme prior to the first machine model being executed; and to decompress the second data, the processing array is to decompress the second data with the processing elements.

12. A method comprising:

compressing first data based on a first compression scheme to generate second data, wherein the first data is associated with a first machine learning model;

storing the second data into a memory;

adjusting a first entry of a lookup table to correspond to the first compression scheme based on the first data being compressed based on the first compression scheme;

providing the second data from the memory to processing elements of a processing array during execution of the first machine learning model; and decompressing, at the processing array, the second data based on the lookup table to obtain the first data;

wherein: the first data includes one or more of weights or biases; the first compression scheme is an Asymmetric Numeral Systems compression scheme; the first data is to be compressed based on the first compression scheme prior to the first machine model being executed; and to decompress the second data, the processing array is to decompress the second data with the processing elements, wherein the method, further comprising:

determining that compression of the first data with the first compression scheme reduces a size of the first data to be less than or equal to an available memory space of the memory;

predicting that the first compression scheme is to be applied at least a first number of times;

determining that the at least the first number of times meets a reuse threshold;

selecting the first compression scheme based on the at least the first number of times meeting the reuse threshold, and compression of the first data with the first compression scheme reducing the size of the first data to be less than or equal to the available memory space;

generating metadata to associate the first compression scheme with the second data; and storing the second data in association with the metadata into the memory.

13. The method of claim 12, further comprising:

compressing third data based on a second compression scheme to generate fourth data, wherein the third data is associated with a second machine learning model;

storing the fourth data into the memory;

adjusting a second entry of the lookup table to correspond to the second compression scheme based on the third data being compressed based on the second compression scheme;

providing the third data from the memory to the processing array during execution of the second machine learning model; and decompressing, at the processing array, the fourth data based on the lookup table to obtain the third data.

14. The method of claim 13, further comprising:

replacing the first entry in the lookup table with the second entry.

15. The method of claim 13, further comprising:

inserting the second entry into the lookup table so that the lookup table includes the first entry and the second entry.

16. The method of claim 12, further comprising:

identifying that a first portion of the first data is compressible by an amount based on the first compression scheme; and determining that the first portion is to be compressed with the first compression scheme based on the amount meeting a compression threshold.

* * * * *